(12) United States Patent
Tsuji

(10) Patent No.: US 8,797,821 B2
(45) Date of Patent: *Aug. 5, 2014

(54) CARD CONTROLLER CONTROLLING SEMICONDUCTOR MEMORY INCLUDING MEMORY CELL HAVING CHARGE ACCUMULATION LAYER AND CONTROL GATE

(75) Inventor: Hidetaka Tsuji, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 108 days.

This patent is subject to a terminal disclaimer.

(21) Appl. No.: 13/550,051

(22) Filed: Jul. 16, 2012

(65) Prior Publication Data

US 2012/0281473 A1    Nov. 8, 2012

Related U.S. Application Data

(63) Continuation of application No. 13/190,877, filed on Jul. 26, 2011, now Pat. No. 8,243,545, which is a continuation of application No. 12/534,367, filed on Aug. 3, 2009, now Pat. No. 8,009,503, which is a continuation of application No. 11/767,865, filed on Jun. 25, 2007, now Pat. No. 7,580,315.

(30) Foreign Application Priority Data

Jun. 30, 2006 (JP) ................................ 2006-182254

(51) Int. Cl.
*G11C 11/00* (2006.01)
(52) U.S. Cl.
USPC ............ 365/230.03; 365/185.11; 365/189.07; 365/236

(58) Field of Classification Search
USPC .................. 365/230.03, 185.11, 189.07, 236
See application file for complete search history.

(56) References Cited

U.S. PATENT DOCUMENTS

| | | | |
|---|---|---|---|
| 5,603,001 A | 2/1997 | Sukegawa et al. | |
| 6,141,287 A * | 10/2000 | Mattausch | 365/230.03 |
| 6,353,553 B1 | 3/2002 | Tamada et al. | |
| 6,496,409 B2 | 12/2002 | Kobayashi et al. | |
| 6,603,680 B2 | 8/2003 | Kanamitsu et al. | |
| 6,671,214 B2 | 12/2003 | Abedifard et al. | |
| 6,731,540 B2 | 5/2004 | Lee et al. | |
| 6,789,158 B2 | 9/2004 | Takahashi | |
| 6,906,938 B2 * | 6/2005 | Kaginele | 365/49.1 |
| 7,012,835 B2 | 3/2006 | Gonzalez et al. | |
| 7,061,812 B2 | 6/2006 | Shinagawa et al. | |
| 7,580,315 B2 | 8/2009 | Tsuji | |

(Continued)

FOREIGN PATENT DOCUMENTS

JP    2006-18471    1/2006

*Primary Examiner* — Son Dinh
(74) *Attorney, Agent, or Firm* — Oblon, Spivak, McClelland, Maier & Neustadt, L.L.P.

(57) ABSTRACT

A card controller includes an arithmetic processing device. The controller writes data to a semiconductor memory having a first memory block and a second memory block each including a plurality of nonvolatile memory cells each configured to hold at least 2 bits, data in the first memory block and data in the second memory block being each erased at a time. The arithmetic processing device writes the data to the memory cells in the first memory block using an upper bit and a lower bit of the at least 2 bits and writes the data to the memory cells in the second memory block using only the lower bit of the at least 2 bits.

20 Claims, 18 Drawing Sheets

(56) References Cited

U.S. PATENT DOCUMENTS

| | | | |
|---|---|---|---|
| 7,881,106 B2 | 2/2011 | Sukegawa | |
| 8,243,545 B2 * | 8/2012 | Tsuji | 365/230.03 |
| 2002/0114178 A1 | 8/2002 | Sakui | |
| 2005/0223211 A1 | 10/2005 | Sukegawa et al. | |
| 2006/0004969 A1 | 1/2006 | Suda | |
| 2006/0215450 A1 | 9/2006 | Honma et al. | |

* cited by examiner

| Pin No. | Signal |
|---|---|
| Pin 1 | Card detection / data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

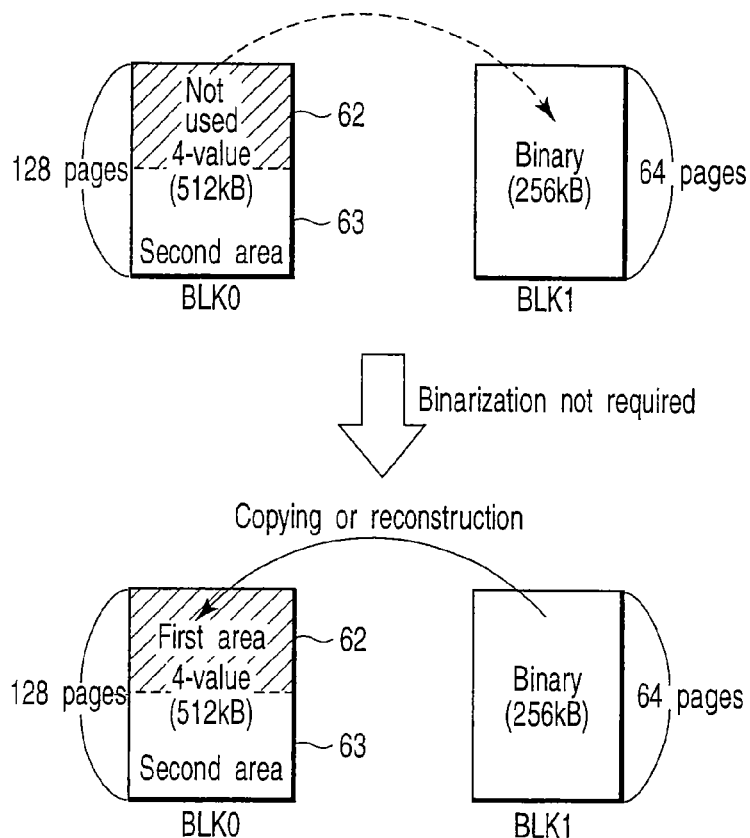
F I G. 30
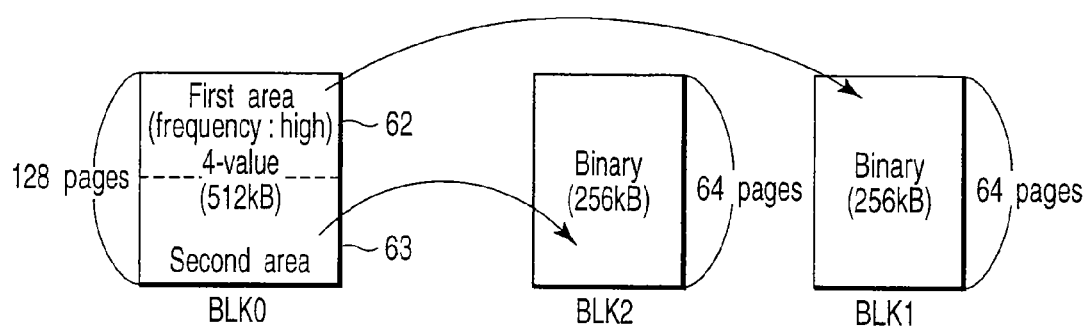
F I G. 31

CARD CONTROLLER CONTROLLING SEMICONDUCTOR MEMORY INCLUDING MEMORY CELL HAVING CHARGE ACCUMULATION LAYER AND CONTROL GATE

CROSS-REFERENCE TO RELATED APPLICATIONS

This application is Continuation of application Ser. No. 13/190,877 filed Jul. 26, 2011 which is a continuation of Ser. No. 12/534,367, filed Aug. 3, 2009, which is a Continuation of application Ser. No. 11/767,865 filed Jun. 25, 2007 which is based upon and claims the benefit of priority from prior Japanese Patent Application No. 2006-182254, filed Jun. 30, 2006, the entire contents of each of which are incorporated herein by reference.

BACKGROUND OF THE INVENTION

1. Field of the Invention

The present invention relates to a card controller and a memory card. For example, the present invention relates to a card controller that controls a semiconductor memory including memory cells each having a charge accumulation layer and a control gate.

2. Description of the Related Art

In recent years, the rapid growth of digital cameras and portable audio players has increased demand for large-capacity nonvolatile semiconductor memories. NAND flash memories (hereinafter sometimes simply referred to as flash memories) have been extensively used as nonvolatile semiconductor memories.

In the NAND flash memory, data in a plurality of memory cells are erased at a time. This erase unit is hereinafter referred to as a memory block. The characteristics of the NAND flash memory prevent overwriting of data. Consequently, for data updating, it is necessary to write new data to an erase memory block, while copying the other data in a memory block holding the non-updated data to the erase memory block (this process is sometimes called copying). Thus, even if an amount of data smaller than the size of a memory block needs to be updated, the data must be written to the erase memory block in memory block units.

Thus, to write a small amount of data, a known method uses a memory block different from the one to which the data is to be originally written, as a cache (see, for example, Jpn. Pat. Appln. KOKAI Publication No. 2006-18471). However, to write data already written to the cache back to the original memory block, this method must also write the data in memory block units. Thus, disadvantageously, data update takes a long time.

BRIEF SUMMARY OF THE INVENTION

A card controller according to an aspect of the present invention which writes data to a semiconductor memory having a first memory block and a second memory block each including a plurality of nonvolatile memory cells each configured to hold at least 2 bits, data in the first memory block and data in the second memory block being each erased at a time, the card controller includes:

an arithmetic processing device which writes the data to the memory cells in the first memory block using an upper bit and a lower bit of the at least 2 bits and writes the data to the memory cells in the second memory block using only the lower bit of the at least 2 bits.

A memory card according to an aspect of the present invention includes:

a semiconductor memory including a first memory block and a second memory block each including a plurality of nonvolatile memory cells each configured to hold at least 2 bits, data in the first memory block and data in the second memory block being each erased at a time; and a memory controller which writes the data to the semiconductor memory, the memory controller including an arithmetic processing device which writes the data to the memory cells in the first memory block using an upper bit and a lower bit of the at least 2 bits and writes the data to the memory cells in the second memory block using only the lower bit of the at least 2 bits.

BRIEF DESCRIPTION OF THE SEVERAL VIEWS OF THE DRAWING

FIG. 30 is a conceptual diagram showing how a cache is reconstructed in the flash memory in accordance with the a second variation of the second embodiment of the present invention; and FIG. 31 is a conceptual diagram showing how a cache is reconstructed in the flash memory in accordance with a third variation of the second embodiment of the present invention.

DETAILED DESCRIPTION OF THE INVENTION

First Embodiment

Figures 1, 2:
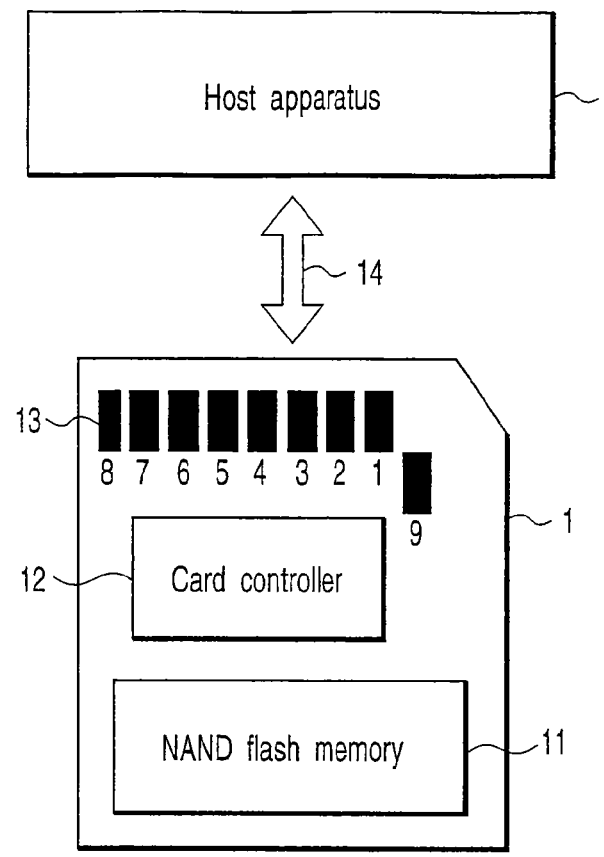
FIG. 1 is a block diagram of a memory system in accordance with a first embodiment of the present invention.
FIG. 2 is a diagram showing the assignment of signals to signal pins on a memory card in accordance with the first embodiment of the present invention.

A card controller and memory card in accordance with a first embodiment of the present invention will be described with reference to FIG. 1. FIG. 1 is a block diagram of a memory system in accordance with the present embodiment.

As shown in the figure, the memory system includes a memory card 1 and a host apparatus 2. The host apparatus 2 includes hardware and software required for accesses to the memory card 1 that is connected to the host apparatus 2 via a bus interface 14. When connected to the host apparatus 2, the memory card 1 is provided with a power supply to operate to execute a process corresponding to an access from the host apparatus 2.

The memory card 1 transmits and receives information to and from the host apparatus 2 via the bus interface 14. The memory card 1 includes a NAND flash memory chip (sometimes simply referred to as a NAND flash memory or a flash memory) 11, a card controller 12 that controls the flash chip 11, and a plurality of signal pins (first to ninth pins) 13.

The plurality of signal pins 13 are electrically connected to the card controller 12. Signals are assigned to the first to ninth pins of the plurality of signal pins 13, for example, as shown in FIG. 2. FIG. 2 is a table showing the first to ninth pins and signals assigned to the pins.

Data 0 to 3 are assigned to the seventh, eighth, ninth, and first pins, respectively. The first pin is also assigned to a card detection signal. Moreover, the second pin is assigned to a command, and the third and sixth pins are assigned to a ground potential Vss. The fourth and fifth pins are assigned to a power supply potential Vdd and a clock signal, respectively.

Further, the memory card 1 is formed to be able to be inserted into and removed from a slot formed in the host apparatus 2. A host controller (not shown) provided in the apparatus 2 communicates various signals and data to and from the card controller 12 in the memory card 1 via the first to ninth pins. For example, to write data to the memory card 1, the host controller transmits a write command to the card controller 12 via the second pin as a serial signal. At this time, the card controller 12 loads the write command to the provided to the second pin in response to the clock signal supplied to the fifth pin.

Then, as described above, the write command is serially input to the card controller 12 utilizing only the second pin. The second pin, assigned for the input of the command, is located between the first pin for data 3 and the third pin for the ground potential Vss as shown in FIG. 2. The plurality of signal pins 13 and the bus interface 14 for them are used to allow the host controller in the host apparatus 2 and the memory card 1 to communicate.

In contrast, the flash memory 11 and the card controller 12 communicate through an interface for a NAND flash memory. Accordingly, although not shown, the flash memory 11 and the card controller 12 are connected together by, for example, 8-bit I/O lines.

For example, to write data to the flash memory 11, the card controller 12 sequentially inputs a data input command 80H, a column address, a page address, data, and a program command 10H to the flash memory 11 via the I/O lines. Here, "H" of the command 80H indicates a hexadecimal number. Actually, an 8-bit signal "10000000" is provided to an 8-bit I/O line in parallel. That is, the interface for NAND flash memories provides a plurality of bits of a command in parallel.

With the interface for NAND flash memories, commands and data for the flash memory 11 are communicated through the same I/O line. Thus, the interface via which the host controller in the host apparatus 2 communicates with the memory card 1 is different from that via which the flash memory 11 communicates with the card controller 12.

Figure 3:
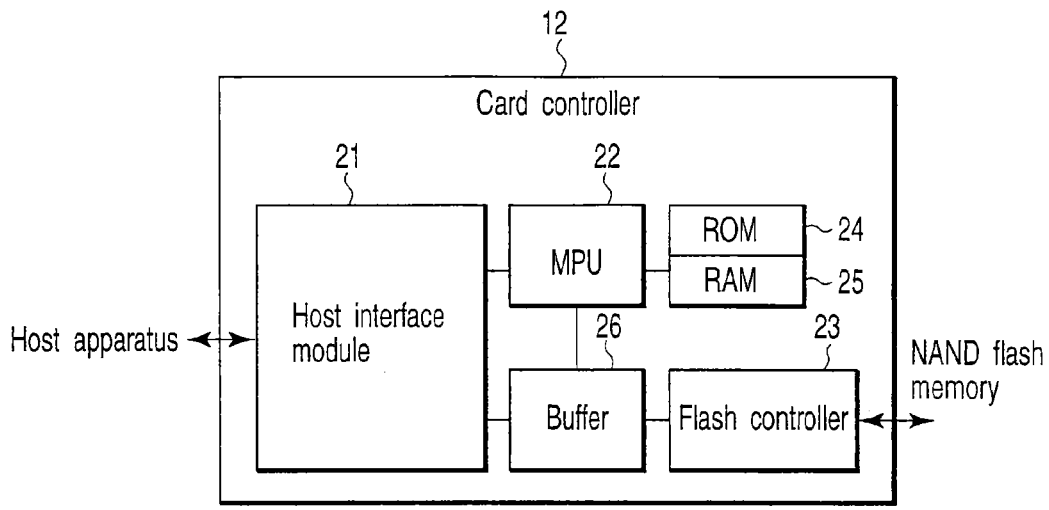
FIG. 3 is a block diagram of a card controller provided in the memory card in accordance with the first embodiment of the present invention.

Now, with reference to FIG. 3, description will be given of the internal configuration of the card controller provided in the memory card 1, shown in FIG. 1. FIG. 3 is a block diagram of the card controller.

The card controller 12 controls the physical state of the interior of the flash memory 11 (for example, at which physical block address particular logical sector address data is located, the ordinal number of the particular logical sector address data, or which block is in an erase state). The card controller 12 has a host interface module 21, microprocessor unit (MPU) 22, a flash controller 23, read-only memory (ROM) 24, random access memory (RAM) 25, and a buffer 26.

The host interface module 21 executes an interfacing process between the card controller 12 and the host apparatus 2.

MPU 22 controls the operation of the entire memory card 1. For example, when the memory card receives a power supply, MPU 22 reads firmware (a control program) stored in ROM 24 onto RAM 25 and then executes a predetermined process to create various tables on RAM 25. MPU 22 receives a write command, a read command, and an erase command from the host apparatus 2 to execute a predetermined process on the flash memory 11 and to control a data transfer process through the buffer 26.

ROM 24 stores, for example, control programs controlled by MPU 22. RAM 25 is used as a work area for MPU 22 to store control programs and various tables. The flash controller 23 executes an interfacing process between the card controller 12 and the flash memory 11.

To write data transmitted by the host apparatus 2 to the flash memory 11 or to transmit data read from the flash memory 11 to the host apparatus 2, the buffer 26 temporarily stores a given amount of data (for example, one page).

Figure 4:
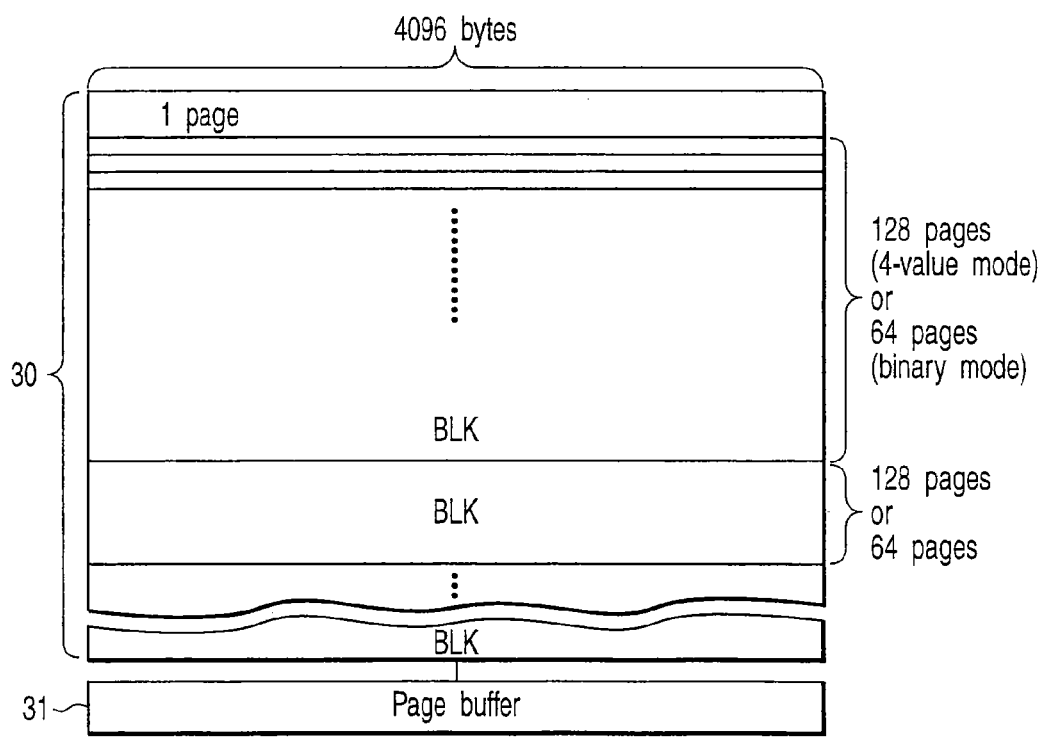
FIG. 4 is a block diagram of a flash memory in accordance with the first embodiment of the present invention.

Now, the internal configuration of the NAND flash memory 11 will be described in brief. FIG. 4 is a block diagram of the NAND flash memory 11. As shown in the figure, the NAND flash memory 11 comprises a memory cell array 30 and a page buffer 31.

The memory cell array 30 includes a plurality of memory cell blocks BLK. As previously described, the memory cell array erases data in memory block BLK units. Each of the memory blocks BLK includes a plurality of memory cells (not shown) arranged in a matrix. Each of the memory cells is a MOS transistor including a stacked gate including a charge accumulation layer (for example, a floating gate) and a control gate. The memory cells in the same row are all connected to the same word line. A data write operation and a data read operation are performed on a set of a plurality of memory cells. The set of memory cells is called a page.

By way of example, in the configuration shown in FIG. 4, each page contains, for example, 4,096 bytes of memory cells. Each memory cell can hold binary data ("0" data or "1" data) or 4-value data ("00" data, "01" data, "10" data, or "11" data). If each memory cell holds 2-bit (4-value) data, two different page addresses are assigned to the 2 bits. Specifically, a lower page address is assigned to a lower-order bit of the 2-bit data, while an upper page address is assigned to a higher-order bit of the 2-bit data. On the other hand, if each memory cell holds 1-bit (binary) data, one page address is assigned to the 1 bit. Thus, holding binary data reduces the number of pages contained in one memory cell block to half compared to holding 4-value data. Then, if each memory cell holds 4-value data, the memory block BLK contains 128 pages. An operation performed when the memory cells hold binary data is hereinafter referred to as the "binary mode". An operation performed when the memory cells hold 4-value data is hereinafter referred to as the "4-value mode". If each memory cell holds binary data, the memory block BLK contains 64 pages. That is, a 4-value mode involves 64 upper pages and 64 lower pages, 128 pages in total. On the other hand, a binary mode involves only 64 lower pages. Accordingly, one memory block BLK has a memory size of (128 pages×4,096 bytes)=512 Kbytes in the 4-value mode and of (64×4,096 bytes)=256 Kbytes in the binary mode.

The page buffer 31 receives and outputs data from and to the memory cell array 30. The page buffer 31 has a storage capacity of 4,096 bytes. For a data write operation, the page buffer 31 executes a data input and output process on the memory cell array 30 by one page corresponding to the storage capacity of the page buffer 31.

FIG. 4 illustrates the case in which an erase unit is 128 or 64 pages. However, the erase unit can be appropriately set. With the same memory size of the NAND flash memory 11, the number of memory blocks BLK increases consistently with the size of the erase unit.

Figure 5:
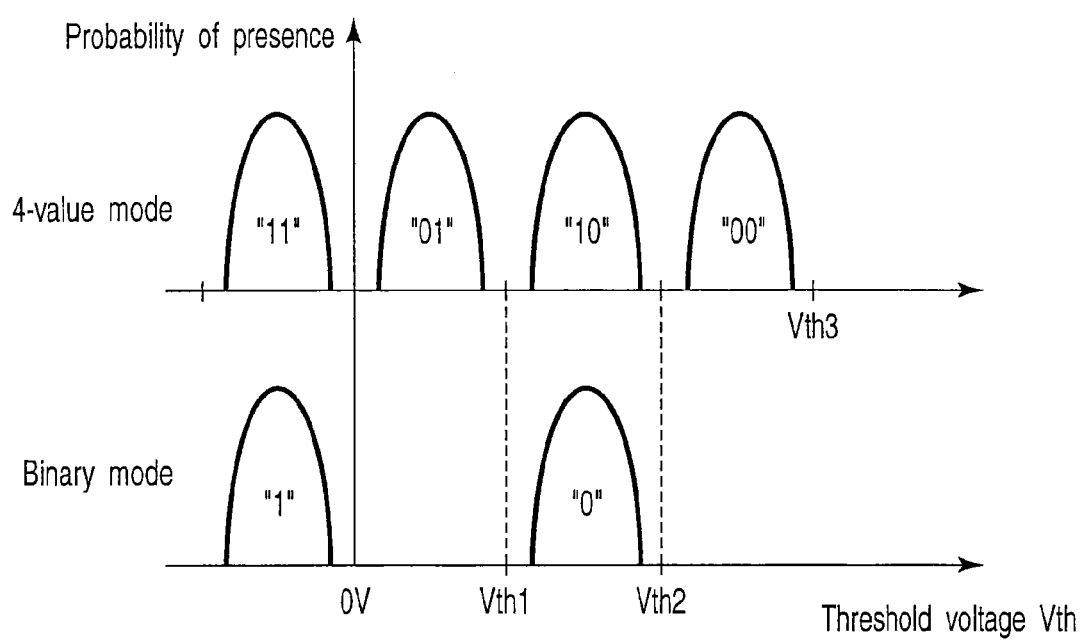
FIG. 5 is a graph showing the distribution of thresholds for the flash memory in accordance with the first embodiment of the present invention.

Now, description will be given of thresholds for the memory cells in the binary mode and for the memory cells in the 4-value mode. FIG. 5 is a graph showing the distribution of thresholds for the memory cells. The abscissa indicates a threshold voltage Vth, and the ordinate indicates the probability of the presence of a memory cell.

First, the 4-value mode will be described. As shown in the figure, the memory cell can hold one of the four data "11", "01", "10", and "00", which are arranged in order of increasing threshold voltage Vth. The threshold voltage Vth for the memory cell holding "11" is Vth<0V. The threshold voltage Vth for the memory cell holding "01" data is 0V<Vth<Vth1. The threshold voltage Vth for the memory cell holding "10" data is Vth1<Vth<Vth2. The threshold voltage Vth for the memory cell holding "00" data is Vth2<Vth<Vth3.

Now, the binary mode will be described. As shown in the figure, the memory cell can hold one of the two data "1" and "0"; the threshold voltage for "1" is lower than that for "0". The threshold voltage for the memory cell holding the "1" data is Vth<0V. The threshold voltage for the memory cell holding the "0" data is Vth1<Vth<Vth2. That is, the "1" data has a threshold voltage equal to that for the "11" data in the 4-value mode. The "0" data has a threshold voltage equal to that for the "10" data in the 4-value mode.

That is, in other words, the binary mode is an operation mode using only the lower-order bit of the 2-bit data in the 4-value mode. Further, the card controller 12 controls whether to write data to the memory cell in the binary mode or the 4-value mode.

Figure 6:
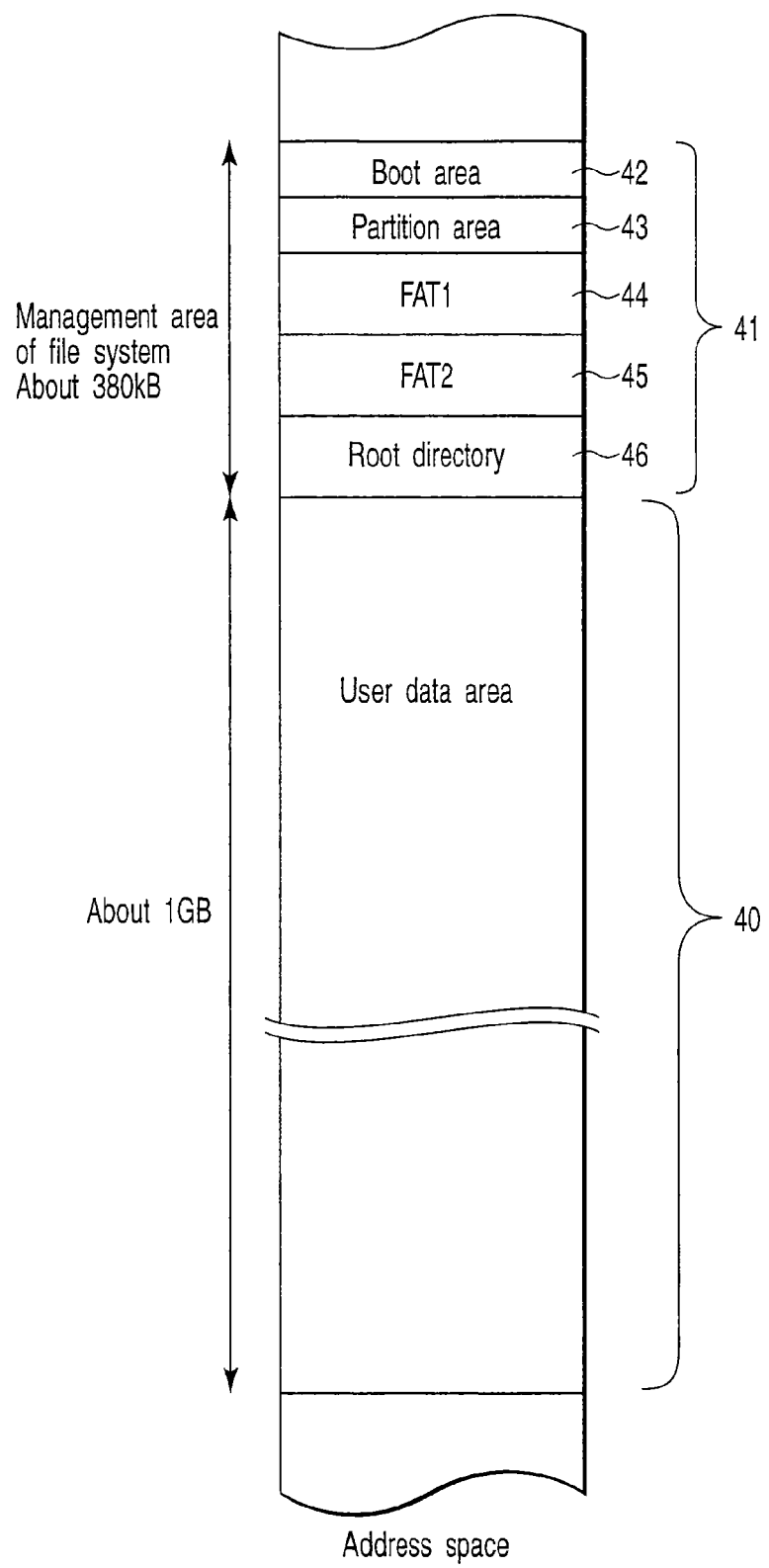
FIG. 6 is a conceptual diagram showing an address space in the flash memory in accordance with the first embodiment of the present invention.

Now, with reference to FIG. 6, description will be given of the configuration of an area in the flash memory 11 to which data is written. FIG. 6 is a conceptual diagram showing a memory space in the memory cell array 30, provided in the flash memory 11. The following description takes the case in which the flash memory 11 has a memory size of about 1 Gbyte. As shown in the figure, the memory space is roughly divided into a user data area 40 and a management area 41.

Net data written by a user is stored in the user data area 40.

The management area 41 manages files (data) recorded in the flash memory 11. A scheme of thus managing files (data) recorded in the memory is called a file system. The following are given for the file system: a method for creating directory information on files and folders in the memory, a method for moving or deleting files or folders, a scheme for recording data, and the location and usage of the management area. By way of example, FIG. 6 shows a file allocation table (FAT) file system.

The management area 41 includes, for example, a boot area 42, a partition information area 43, FAT1 (44), FAT2 (45), and a root directory entry area 46. The boot area 42 stores, for example, boot information. The partition information area 43 stores partition information. FAT1 and FAT2 stores information indicating at which address the data is stored. FAT1 and FAT2 will be described below in brief.

The user data area 40 includes a plurality of areas called clusters. If data to be written has a size larger than a cluster size, the data is divided into clusters for storage. In this case, the clusters to which the data is written may not be consecutive. That is, one data may be written to positionally separate clusters. In this case, management data for managing in which cluster divided data is written is stored in FAT1 and FAT2.

Information on root directory entries is stored in the root directory entry area 46. The following are stored in the root directory entry area 46: a file name or a folder name, a file size, attributes, and the date and time of file updating, as well as a flag indicating which of the clusters indicated in FAT1 and FAT2 is the leading cluster of the file.

Description will be given of the case in which the management area 41 has a size of 380 Kbytes.

Figure 7:
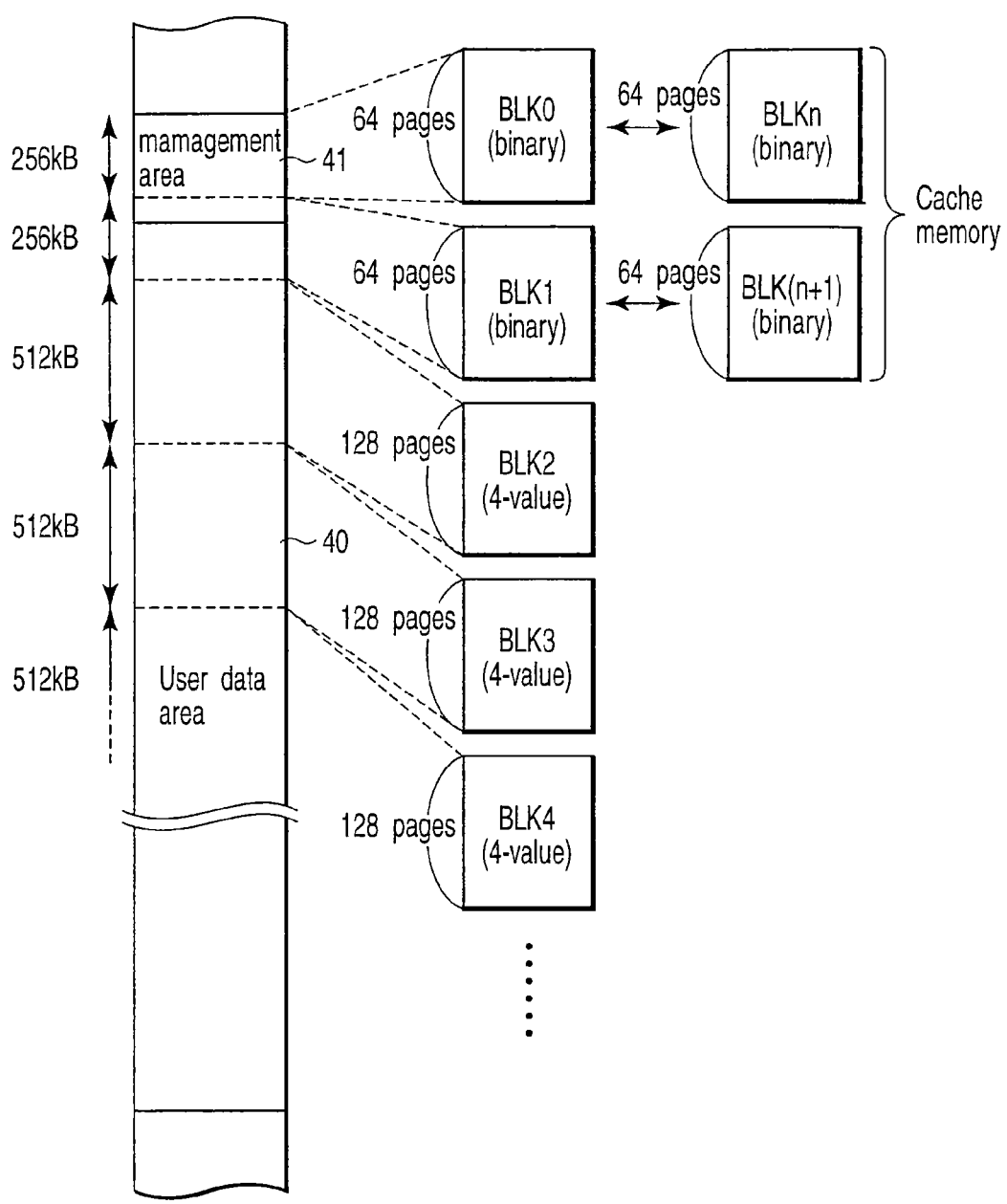
FIG. 7 is a conceptual drawing showing the relationship between an address space and memory blocks in the flash memory in accordance with the first embodiment of the present invention.

Now, with reference to FIG. 7, description will be given of the relationship between the address space shown in FIG. 6 and each of the memory blocks BLK in the memory cell array 30. FIG. 7 is a conceptual diagram showing the address space in the memory cell array 30 and the memory blocks BLK assigned to the areas of the address space.

As described above, the memory blocks BLK in the binary mode have a data size of 256 Kbytes, while the memory blocks BLK in the 4-value mode have a data size of 512 Kbytes. The management area 41 has a size of 380 Kbytes.

First, one memory block BLK0 is assigned for holding of the management area 41. The memory block BLK0 is in the binary mode (256 Kbytes). Consequently, not all the management area 41 can be held only by the memory block BLK0. Thus, a memory block BLK1 further holds the remaining part of the management area 41. The memory block BLK1 is also in the binary mode. The entire area of the memory block BLK1 except the management area 41 is used as the user data area 40. On the other hand, memory blocks BLK2, BLK3, . . . used as the remaining part of the user data area 40 are in the 4-value mode (512 Kbytes).

The memory blocks BLKn (n is a natural number) and BLK(n+1) are used as caches for the memory blocks BLK0 and BLK1, respectively. The memory blocks BLKn and BLK (n+1) are also in the binary mode.

That is, the memory block BLK holding the management area 41, is in the binary mode, and another memory block BLK in the binary mode is assigned as a cache. On the other hand, another memory block BLK holding the user data area 40, is in the 4-value mode, and no particular cache is assigned to this memory block BLK.

With the above configuration, if an instruction is specified ordering data to be written to a logical address corresponding to the management area, MPU 22 write the write data to the block BLKn, used as a cache, in the binary mode. Further, at a predetermined timing, MPU 22 further writes the data in the block BLKn back to the block BLK0 in the binary mode.

The memory system configured as described above exerts effects described below in (1) and (2).

(1) Data can be Updated at Higher Speed.

Data (management information) in the management area 41, used in the FAT system, is more frequently updated than that in the user data area 40. In particular, the information in FAT1 and FAT2 is very frequently updated. That is, the data in the memory block BLK holding the management area 41 needs to be frequently rewritten. However, as also described in Description of the Related Art, the NAND flash memory does not allow overwriting of data. The NAND flash memory thus uses a technique for providing a cache and writing management information to the cache. When the amount of data in the cache reaches a certain given time, the cached data is written back. This is called reconstruction of the cache. More specifically, if the data held in any memory block is updated, the updated data is written to a memory block different from the one that holds the non-updated data. The different memory block functions as a cache memory. If the data is further updated, updated data is written to another page in the memory block functioning as a cache memory. Thus, every time data is updated, the updated data is written to the cache memory. When the amount of data in the cache memory reaches a given value, the latest updated data is written back to the original memory block or another new memory block provided to hold the management area. In this case, not all the other data in the original memory block has been updated; valid data may remain in the original memory block. Consequently, the valid data in the original memory block and the latest updated data in the cache memory are copied to the original memory block or another new memory block provided for holding the management area. This is reconstruction of the cache. With the conventional multi-level NAND flash memory, data is written to each memory block cache memory including the memory block functioning as a cache memory, in a multi-level mode for at least four values.

In this regard, with the configuration in accordance with the present embodiment, MPU 22 assigns the memory block BLK in the binary mode as the management area 41. In writing the updated data to the memory block used as the cache for the management area 41, MPU 22 writes the updated data in the binary mode. To reconstruct a cache, MPU 22 writes back the data in the binary mode. This enables an increase in the speed of data updating. This will be described below in detail.

Figure 8:
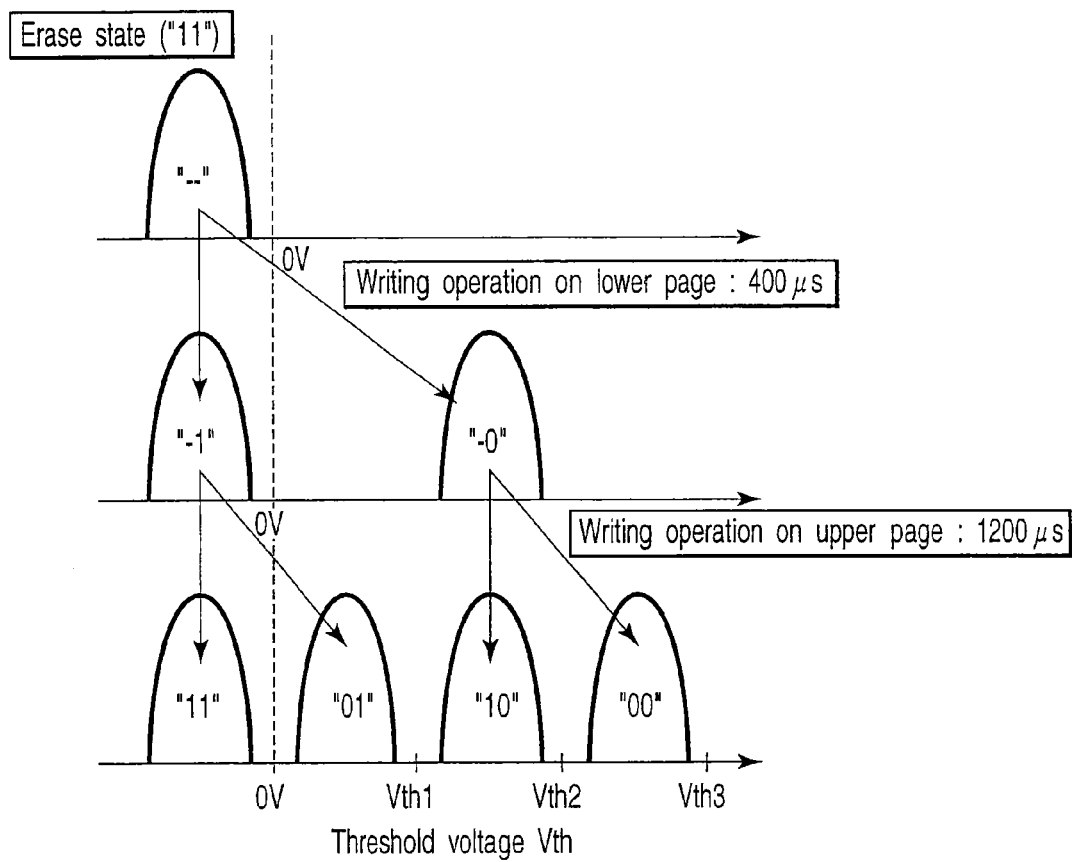
FIG. 8 is a graph showing the distribution of thresholds for the flash memory in accordance with the first embodiment of the present invention.

First, with reference to FIG. 8, description will be given of a method for performing a write operation on a memory cell in the 4-value mode. FIG. 8 is a graph showing the distribution of threshold values for a memory cell; the figure shows a variation in the threshold voltage Vth for the memory cell during a write operation. As described above, data is written to each page at a time. Further, the data is written first to the lower page and then to the upper page.

Before a write operation, the memory cell is in an erase state. That is, the threshold voltage Vth for the memory cell has a negative value; the memory cell holds the "11" data. In this state, the data is first written to the lower page. If the lower page is "1", no electrons are injected into the floating gate, with the threshold voltage Vth remaining unchanged. If the lower page is "0", electrons are injected into the floating gate, the threshold voltage Vth varies in a positive direction, resulting in about Vth1<Vth<Vth2. That is, the threshold for the memory cell becomes almost the same as that observed when the memory cell holds "10".

Then, the data is written to the upper page. First, description will be given of the case in which the lower page is "1". If the lower page is "1" and the upper page is also "1", no electrons are injected into the floating gate even during a write operation on the upper page. The threshold value Vth thus maintains a negative value. As a result, "11" is written to the memory cell. If the upper page is "0", electrons are injected into the floating gate. This varies the threshold voltage Vth from a negative side to a positive side, resulting in 0V<Vth<Vth1. That is, "01" is written to the memory cell.

Now, description will be given of the case in which the lower page is "0". If the lower page is "0" and the upper page is also "1", no electrons are injected into the floating gate during a write operation on the upper page. Consequently, a value resulting from the write operation on the lower page is maintained. That is, Vth1<Vth<Vth2, causing "10" to be written to the memory cell. If the upper page is "0", electrons are injected into the floating gate. This varies the threshold voltage Vth in the positive direction, resulting in Vth2<Vth<Vth3. That is, "00" is written to the memory cell.

For a memory cell in the 4-value mode, a write operation needs to be performed on both the upper page and the lower page. On the other hand, for a memory cell in the binary mode, only the lower-order bit in the 4-value mode is used as described above. Thus, a write operation needs to be performed only on the lower page and not on the upper page. Furthermore, in the NAND flash memory, the speed at which data is written to the lower page is generally higher than that at which data is written to the upper page. For example, the time required for a write operation on the lower page is about 400 μs. The time required for a write operation on the upper page is about 1,200 μs.

Figure 9:
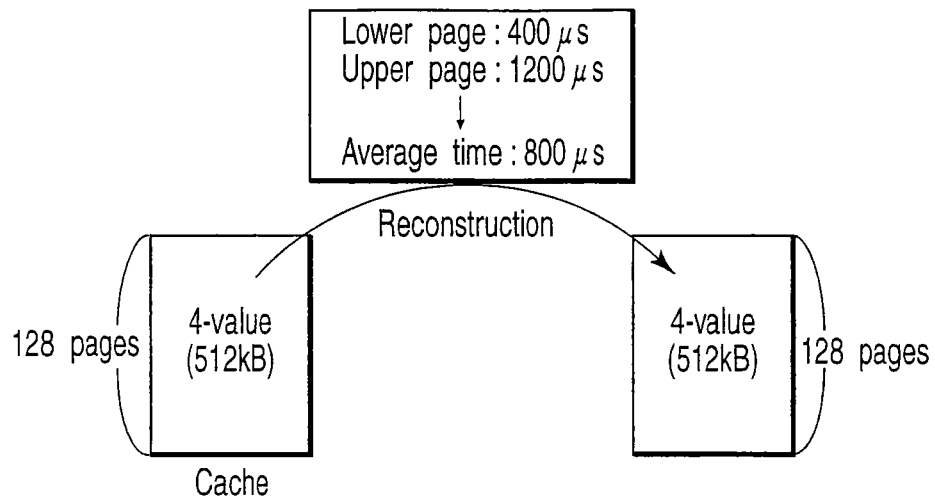
FIG. 9 is a conceptual diagram showing how a cache is reconstructed in the flash memory.

FIG. 9 is a conceptual diagram showing how a cache is reconstructed if the management area 41 is held using memory blocks BLK in the 4-value mode. As shown in the figure, in the 4-value mode, the time required for a write operation on each of the lower and upper pages, that is, the average write time, is, 800 μs. Therefore, the time required to write data to one memory block BLK is (800 μs×128 pages)= about 102.4 ms.

Figure 10:
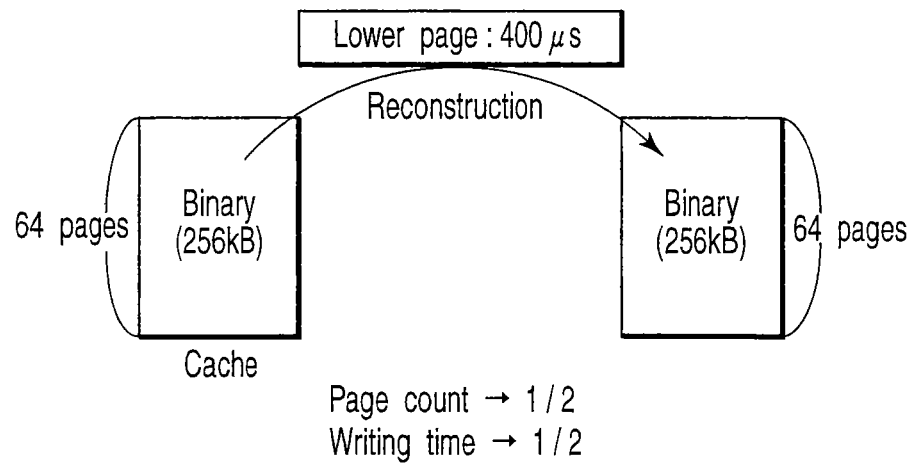
FIG. 10 is conceptual diagram showing how the cache is reconstructed in the flash memory in accordance with the first embodiment of the present invention.

In contrast, the configuration in accordance with the present embodiment makes it possible to reduce the time required for a write operation to one-fourth of that required in the case shown in FIG. 9. FIG. 10 is a conceptual diagram showing how a cache is reconstructed if the management area 41 is held using memory blocks BLK in the binary mode. As shown in the figure, in the binary mode, the data needs to be written only to the lower page and not to the upper page. Consequently, the number of pages to which the data is to be written is half of that in the case shown in FIG. 1. Moreover, the time required for a write operation on the lower page is 400 μs, which is half the average write time of 800 μs in the case shown in FIG. 9. Consequently, the time required for a write operation on one page is about 400 μs. As a result, the time for a write operation on one memory block BLK is (400 μs×64 pages)=about 25.6 ms. That is, compared to the case in which the management area 41 is held using memory blocks BLK in the 4-value mode, the present embodiment reduces the write time to half and the number of pages to half. Thus, the required time is reduced to one-fourth of the time required in the 4-value mode. This increases the speed at which updated data is written to a memory block functioning as a cache memory and the speed at which a cache is reconstructed. This in turn significantly increases the speed at which data is updated in the memory system.

(2) The Reliability of the NAND Flash Memory can be Improved.

In the NAND flash memory, an operation of writing multi-level data for the 4-value mode or the like causes more heavily stresses to memory cells than a write operation in the binary mode. This is because a large amount of data is written to each memory cell, in other words, a large number of electrons are injected into the floating gate. In particular, in the management area 41, data is frequently updated and the memory cell is likely to be exhausted.

In this regard, according to the present embodiment, the memory block BLK holding the management area 41 is in the binary mode. Accordingly, in spite of frequent data updating, the memory cells can be prevented from being exhausted, improving the data holding characteristic. As a result, the reliability of the NAND flash memory can be improved.

Figure 11:
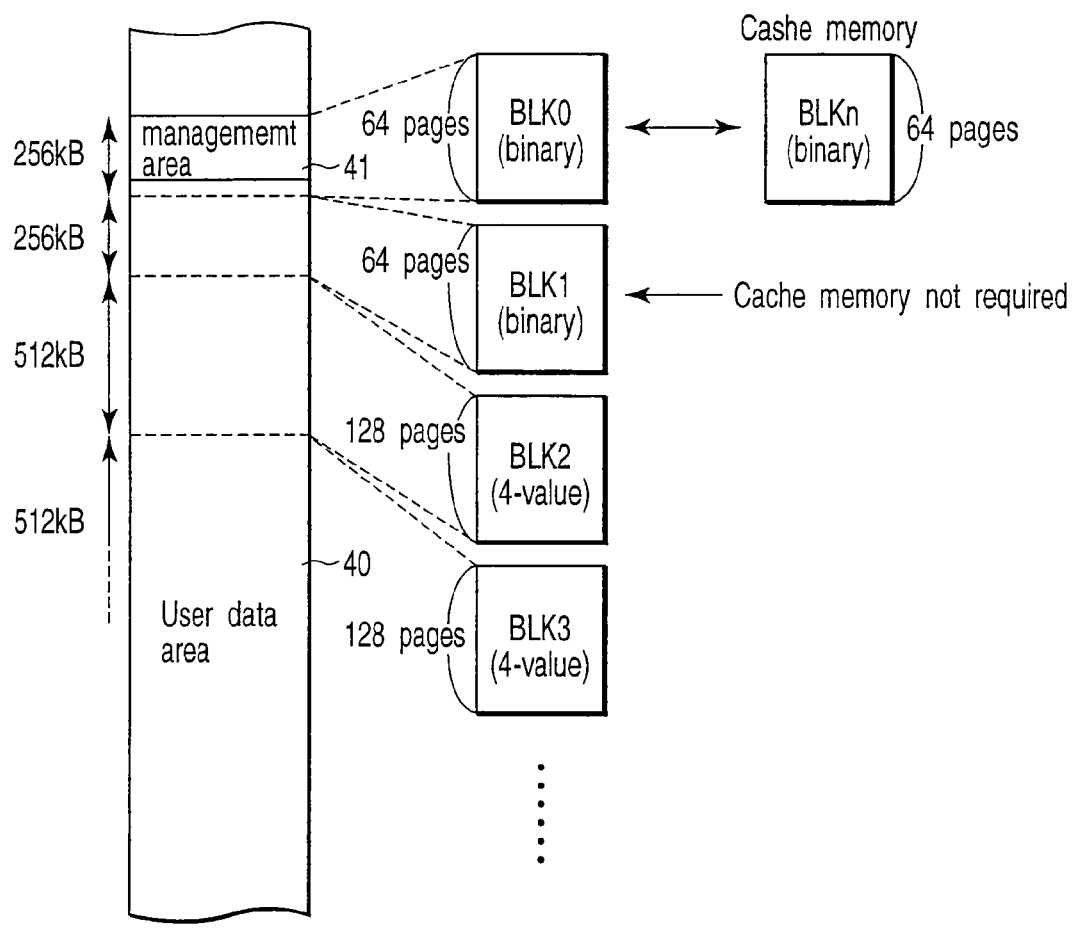
FIG. 11 is a conceptual drawing showing the relationship between an address space and memory blocks in the flash memory in accordance with a variation of the first embodiment of the present invention.

The above embodiment has been described taking the case in which the size of the management area 41 is larger than that of one block in the binary mode. However, if the size of the management area 41 is smaller than that of one block in the binary mode, one of the caches need not be provided. FIG. 11 shows such a case; FIG. 11 is a conceptual diagram showing the relationship between the address space in the memory cell array 30 and the memory blocks BLK assigned to the areas of the address area.

As shown in the figure, if the management area 41 has a size of at most 256 Kbytes, the management area 41 can be held only by one memory block BLK0. Consequently, a cache needs to be provided only for the memory block BLK0 and not for the memory block BLK1. In FIG. 11, the memory block BLK1 is in the binary mode but may be in the 4-value mode.

Second Embodiment

Figure 12:
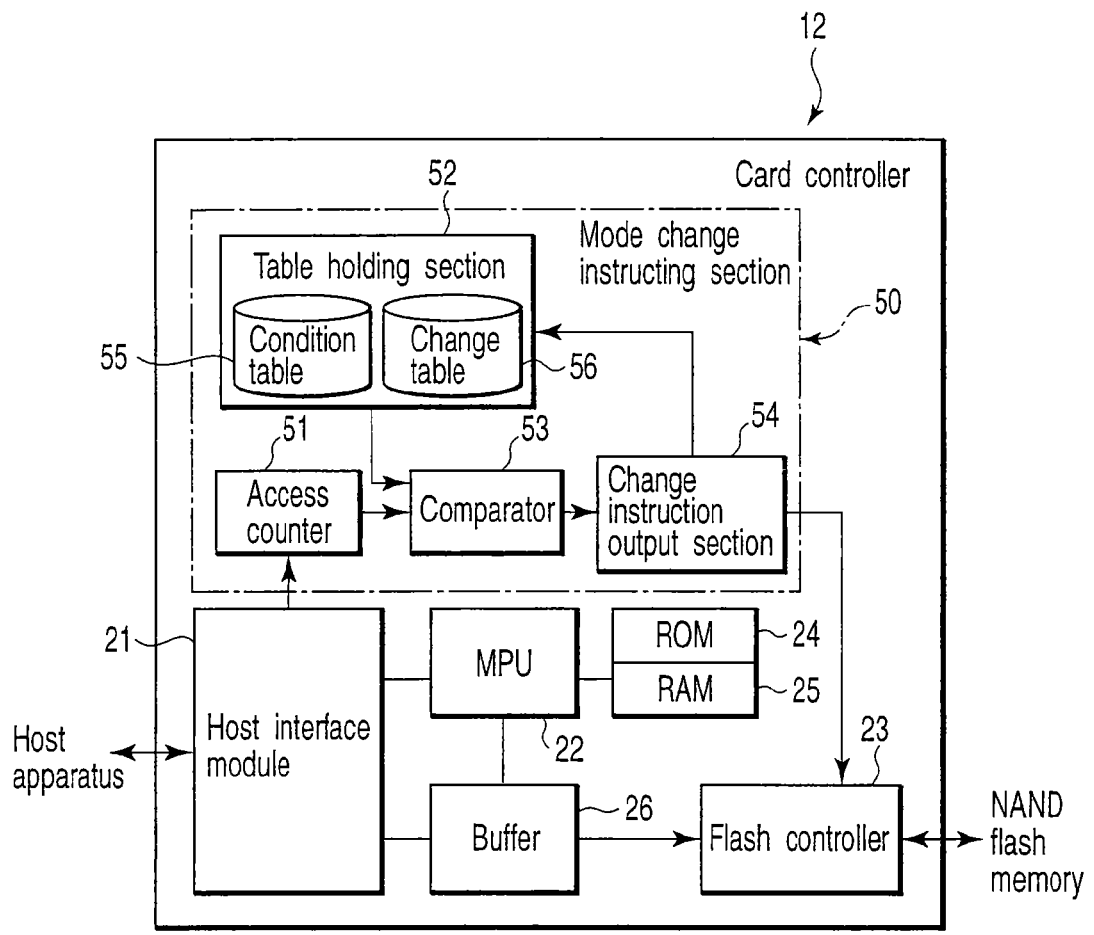
FIG. 12 is a block diagram of a card controller provided in a memory card in accordance with a second embodiment of the present invention.

Now, description will be given of a card controller and memory card in accordance with a second embodiment of the present invention. The present embodiment relates to a configuration that changes a memory cell block from the 4-value mode to the binary mode in the first embodiment. FIG. 12 is a block diagram of the card controller 12, provided in the memory card 1 in a memory system in accordance with the present embodiment. The remaining part of the configuration is as described in the first embodiment and will not be described below. The memory blocks BLK are initially in the 4-value mode.

As shown in the figure, the card controller 12 includes a mode change instructing section 50 in addition to the same components as those described in the first embodiment with reference to FIG. 3. The mode change instructing portion 50 instructs each of the memory blocks BLK in the NAND flash memory 11 to change from the 4-value mode to the binary mode (this operation is sometimes referred to as a mode change). The mode change instructing section 50 includes an access counter 51, a table holding section 52, a comparator 53, and a change instruction output section 54.

The access counter 51 counts the number of write accesses to each of the memory blocks BLK in the NAND flash memory 11.

The table holding section 52 holds a condition table 55 and a change table 56. The condition table 55 holds conditions for a mode change. That is, the condition table 55 holds information indicating how many accesses made to a certain memory block BLK triggers a mode change. The change table holds information whether each memory block BLK is in the binary mode or the 4-value mode. It is sufficient for the change table to be able to hold information on memory blocks that have changed from the 4-value mode to the binary mode.

The comparator 53 compares the count in the access counter 51 with the conditions held in the condition table 55 in the data holding section 52.

The change instruction output section 54 outputs an instruction to change from the 4-value mode to the binary mode, on the basis of the comparison result provided by the comparator 53. A change instruction is provided to the NAND flash memory 11 via the flash controller 23. Upon outputting a change instruction, the change instruction output section 54 outputs information indicating which of the blocks BLK has changed to the 4-value mode, to the table holding section 52 to update the change table 56.

Figure 13:
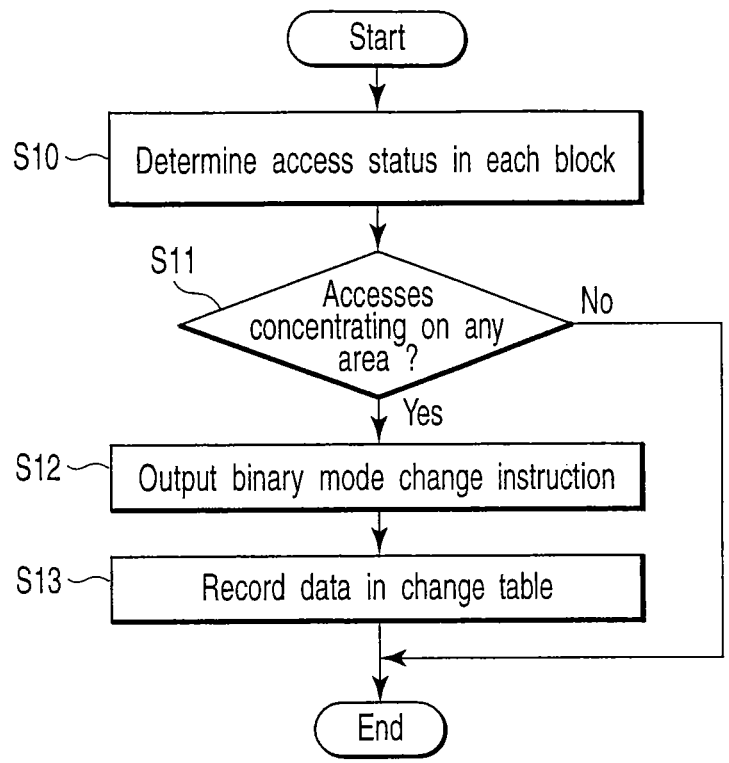
FIG. 13 is a flowchart showing the operation of the card controller provided in the memory card in accordance with the second embodiment of the present invention.

Now, the operation of the card controller 12 configured as described above will be described with reference to FIG. 13. FIG. 13 is a flowchart of the operation of the card controller 12, specifically showing a process for a mode change from the 4-value mode to the binary mode.

Figure 14:
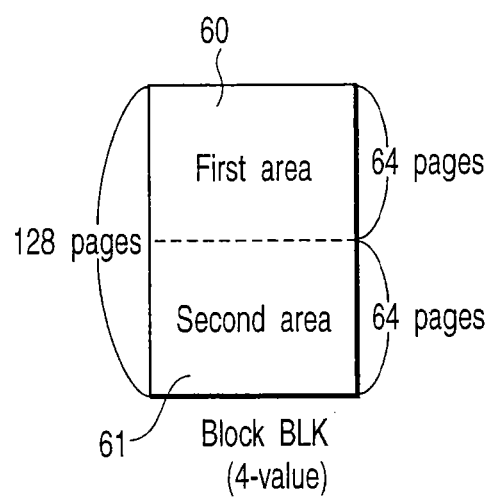
FIG. 14 is a block diagram of a memory block provided in a flash memory in accordance with the second embodiment of the present invention.

First, the card controller 12 determines the status of write accesses to each of the memory blocks BLK in the NAND flash memory 11 (step S10). The access status is determined by, for example, the following method. FIG. 14 is a conceptual diagram of a certain block BLK. As described in the first embodiment, the memory block BLK is in the 4-value mode and thus has 128 pages and a memory size of 512 Kbytes. The card controller 12 controllably divides the memory block BLK into a first area 60 and a second area 61 each having 64 pages. The access counter 51 reads a write instruction and an address signal received by the host interface module to count the numbers of accesses to the first area 60 and to the second area 61. The counting starts, for example, when one of the areas is consecutively accessed.

If accesses concentrate on one of the first area 60 and the second area 61 (step S11, YES), the change instruction output section 54 outputs an instruction to change from the 4-value mode to the binary mode (step S12). The determination in step S11 is made on the basis of the result of the comparison, by the comparator 53, of the count in the access counter 51 with the mode change condition in the condition table 55. The mode change condition is, for example, a mode change threshold for the count. When the count exceeds the mode change threshold, the change instruction output section 54 outputs a change instruction. The change instruction output section 54 outputs information indicating that the mode has been changed, to update the change table 56 (step S13).

Figure 16:
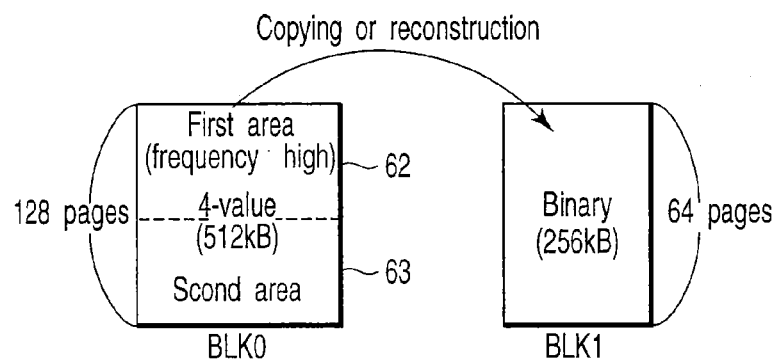
FIG. 16 is a conceptual diagram showing how a cache is reconstructed in the flash memory in accordance with the second embodiment of the present invention.
Figure 17:
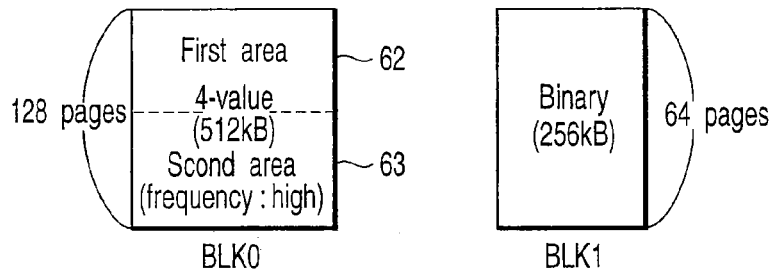
FIG. 17 is a block diagram of memory blocks provided in the flash memory in accordance with the second embodiment of the present invention.
Figure 18:
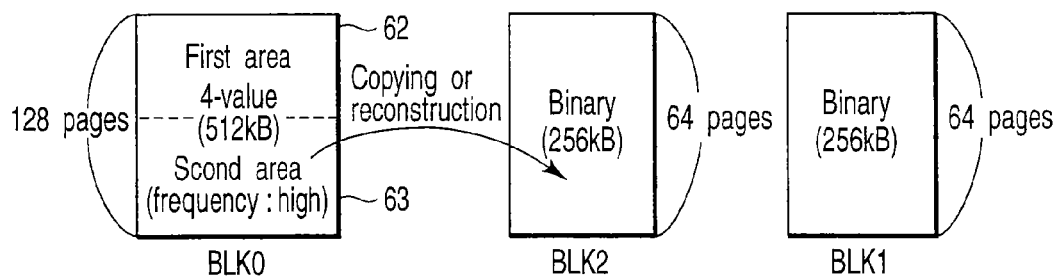
FIG. 18 is a conceptual diagram showing how a cache is reconstructed in the flash memory in accordance with the second embodiment of the present invention.

Now, description will be given of how the NAND flash memory 11 operates upon receiving a change instruction from the card controller 12. FIGS. 15 to 18 are conceptual diagrams of memory blocks. In particular, FIGS. 16 to 18 show how data is copied or a cache is reconstructed.

Figure 15:
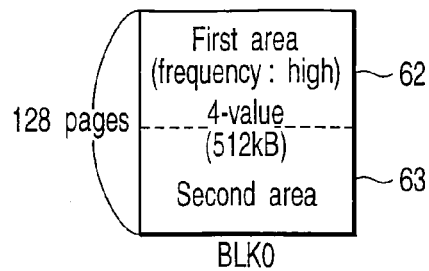
FIG. 15 is a block diagram of a memory block provided in the flash memory in accordance with the second embodiment of the present invention.

First, as shown in FIG. 15, the memory block BLK0 is in the 4-value mode and has 128 pages and a memory size of 512 Kbytes. It is assumed that a write operation is frequently performed on a first area 64-1 of the memory block BLK0 and that the frequency meets the mode change condition in the condition table 55 in step S11. Thus, the change instruction output section 54 outputs a change instruction to change a first area 62 to the binary mode.

Then, as shown in FIG. 16, to copy data or reconstruct a cache, the NAND flash memory 11 writes the data in the first area 62 to the memory block BLK1 in the binary mode. The memory block BLK1 is in the binary mode and thus has 128 pages and a memory size of 256 Kbytes.

Then, as shown in FIG. 17, it is assumed that the frequency of a write operation performed on a second area 63 of the memory block BLK0 increases, and in step S11, meets the mode change condition in the condition table 55. Thus, the change instruction output section 54 outputs an instruction to change the second area 63 to the binary mode.

Then, as shown in FIG. 18, also to copy data or reconstruct a cache, the NAND flash memory 11 writes the data in the second area 63 to the memory block BLK2 in the binary mode. The memory block BLK2 is in the binary mode and thus has 64 pages and a memory size of 256 Kbytes.

As described above, the configuration in accordance with the present embodiment exerts not only the effects (1) and (2) described in the first embodiment but also an effect (3) described below.

(3) The Nand Flash Memory can be Used Efficiently.

The configuration in accordance with the present embodiment appropriately changes not only the management area but also an area in which the data is frequently changed. This enables an efficient increase in the speed at which the data in the NAND flash memory is updated.

Figure 19:
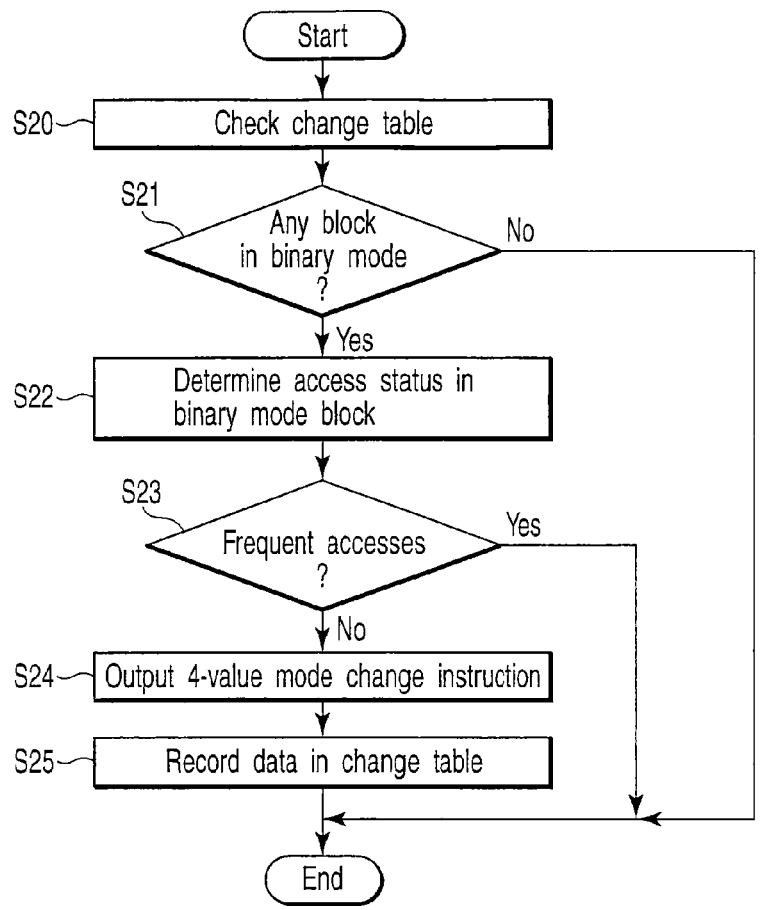
FIG. 19 is a flowchart showing the operation of a card controller provided in a memory card in accordance with a first variation of the second embodiment of the present invention.

The above embodiment has been described taking the case in which the card controller 12 changes the 4-value mode to the binary mode. However, the binary mode may be controllably changed to the 4-value mode in accordance with the data update frequency. This will be described with reference to FIG. 19. FIG. 19 is a flowchart showing a process executed by the card controller 12.

First, the change instruction output section 54 checks the change table 56 in the table holding section 52 to determine whether or not any of the memory blocks BLK is in the binary mode (step S20). If any memory block BLK is in the binary mode (step S21, YES), the card controller 12 determines the write access status of that block BLK (step S22). The access status is checked using the access counter 51 and the comparator 53. That is, the change instruction output section 54 instructs the access counter 51 to read a write instruction and an address signal received by the host interface module to count the number of accesses to the memory block BLK. Further, a change condition for a change from the binary mode to the 4-value mode is held in the condition table 55. The comparator 53 compares the change condition with the count.

If the memory block BLK is not frequently accessed (step S23, NO), the change instruction output section 54 outputs an instruction to change from the binary mode to the 4-value mode (step S24). The change instruction output section 54 outputs information indicating that the mode has been changed, to the table holding section 52 to update the change table 56 (step S25).

The above method enables only the required area to be set in the binary mode only for the required period. This allows the memory areas of the NAND flash memory 11 to be used more efficiently.

Further, the above embodiment has been described taking the case in which the card controller 12 has the mode change instructing section 50 separately from MPU 22 and the like. MPU 22 may provide all the functions of the mode change instructing section 50 or some of the functions of the mode change instructing section 50, for example, the functions of the comparator 53 and the change instruction output section 54, or RAM 25 may provide the functions of the table holding section 52.

Third Embodiment

Figure 20:
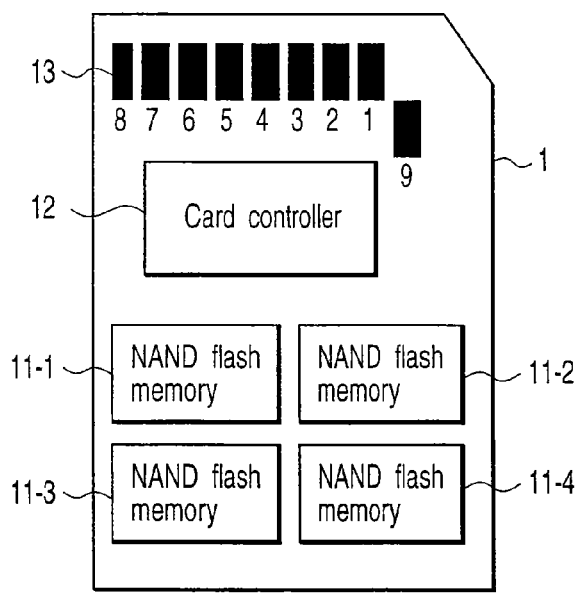
FIG. 20 is a block diagram of a memory system in accordance with a third embodiment of the present invention.

Now, a card controller and a memory card in accordance with a third embodiment will be described. The present embodiment relates to the second embodiment in which the memory card 1 has a plurality of memory chips (NAND flash memories 11). FIG. 20 is a block diagram of the memory card 1 in accordance with the present embodiment. As shown in the figure, the memory card 1 has four NAND flash memories 11-1, 11-2, 11-3, and 11-4 in the configuration described in the first embodiment with reference to FIG. 1.

Figure 21:
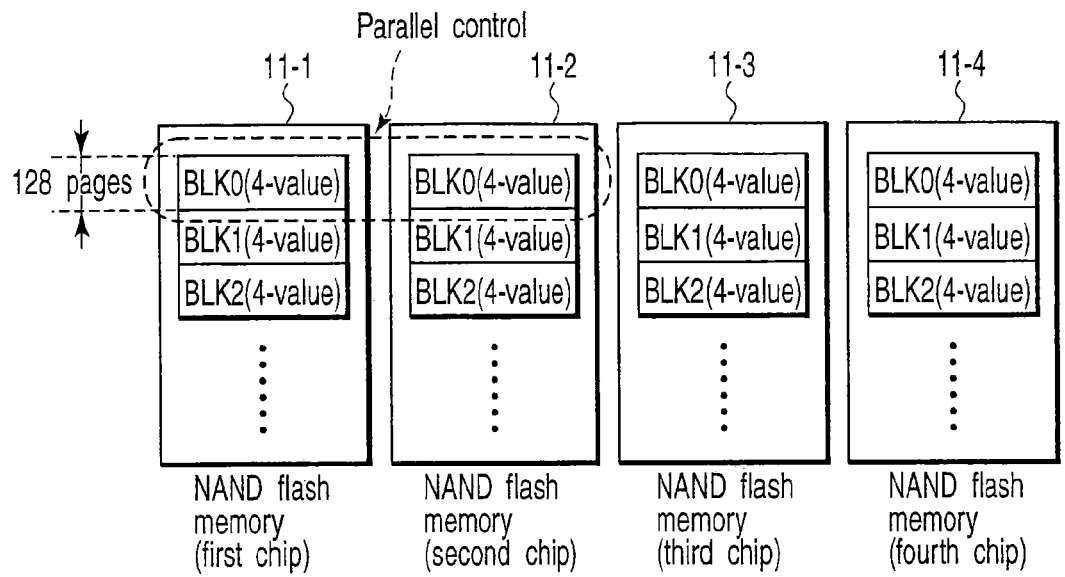
FIG. 21 is a block diagram of a flash memory system in accordance with the third embodiment of the present invention.

FIG. 21 is a block diagram showing the configuration of the memory cell array 30 in each of the flash memories 11-1 to 11-4. As shown in the figure, each of the flash memories 11-1 to 11-4 has a configuration similar to that of the flash memory 11, described in the first embodiment. That is, each flash memory comprises the plurality of memory blocks BLK0, BLK1, BLK3, . . . , and each memory block BLK contains 128 pages. Further, each block BLK is in the 4-value mode.

The card controller 12 can control the plurality of flash memories 11-1 to 11-4, configured as described above, in parallel. Description will be given below of the case in which the card controller 12 controls the plurality of flash memories 11-1 and 11-2 in parallel. The parallel control is such a process as described below. The card controller 12 simultaneously writes and reads data to and from the blocks BLKi (i is a natural number) provided in each of the flash memories 11-1 and 11-2. Therefore, logical addresses are consecutive among the memory blocks in different semiconductor chips.

Figure 22:
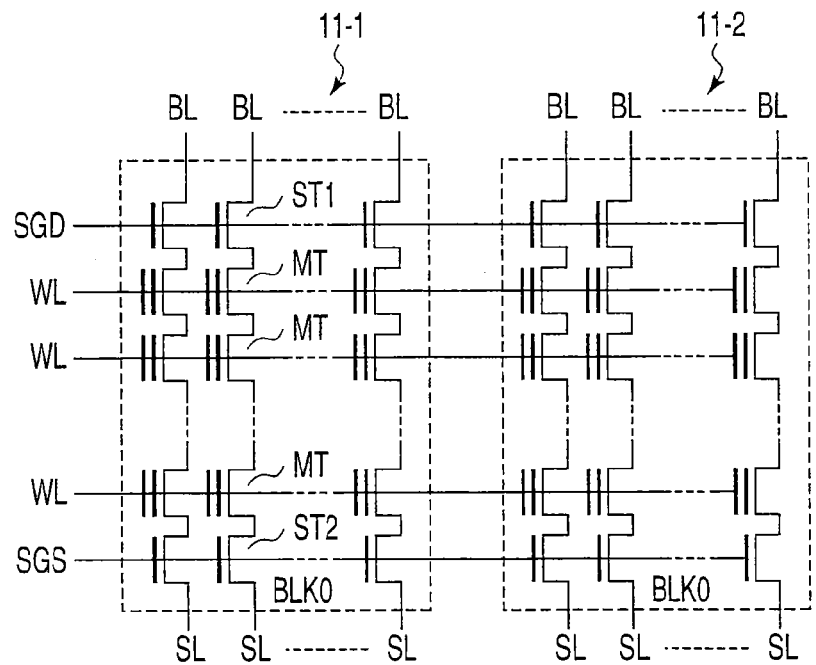
FIG. 22 is an equivalent circuit diagram of a memory cell array provided in the flash memory system in accordance with the third embodiment of the present invention.

FIG. 22 is a circuit diagram equivalently showing the two memory blocks BLK0 controlled in parallel. As shown in the figure, each of the memory blocks BLK0 includes select transistors ST1 or ST2 and a plurality of memory transistors MT. Drains of the select transistors ST1 is connected to respective bit lines BL. Sources of the select transistors ST2 are connected to respective source lines SL. The memory cell transistors MT have current paths connected in series between a source of the corresponding one of the select transistors ST1 and a drain of the corresponding one of the select transistor ST2. Gates of the select transistors ST1 in the same row are connected to a select gate line SGD. Gates of the select transistors ST2 in the same row are connected to a select gate line SGS. Further, control gates of the memory transistors MT in the same row are connected to the same word line WL.

When parallel control is performed in the above configuration, the select gate lines SGD and SGS and the word lines WL can be assumed to connect the two memory blocks BLK0 together. Accordingly, in the two memory blocks BLK0, data is written to or read from all the memory cell transistors MT connected to the same word line, at a time.

Figure 23:
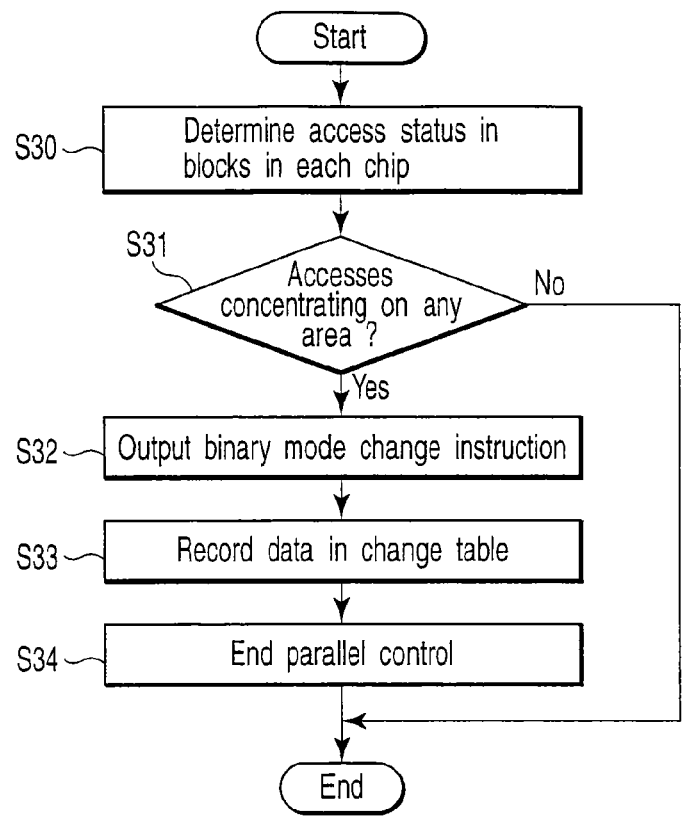
FIG. 23 is a flowchart showing the operation of a card controller provided in the memory card in accordance with the third embodiment of the present invention.

Then, description will be given of a method according to which the card controller 13 controls the NAND flash memories 11-1 and 11-2. FIG. 23 is a flowchart of the operation of the card controller 12, showing a process for a mode change from the 4-value mode to the binary mode.

Figure 24:
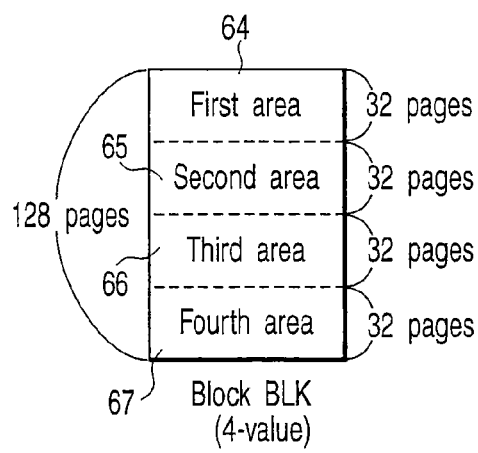
FIG. 24 is a block diagram of a memory block provided in a flash memory in accordance with the third embodiment of the present invention.

First, the card controller 12 determines the write access statuses of the memory blocks BLK in the NAND flash memories 11-1 and 11-2 (step S30). The access status is checked, for example, by the following method. FIG. 24 is a conceptual diagram of a certain memory block BLK. The memory block BLK has 128 pages and is in the binary mode and thus has a memory size of 512 Kbytes. The card controller 12 controllably divides the memory block BLK into a first area 64, a second area 65, a third area 66, and a fourth area 67 each having 32 pages. The access counter 51 reads a write instruction and an address signal received by the host interface module to count the numbers of accesses to the first area 64 and to the second area 67. The counting starts, for example, when one of the areas is consecutively accessed.

If accesses concentrate on one of the areas 64 to 67 (step S31, YES), the change instruction output section 54 outputs an instruction to change from the 4-value mode to the binary mode (step S32). The determination in step S31 is made on the basis of the result of the comparison, by the comparator 53, of the count in the access counter 51 with the mode change condition in the condition table 55 as described in the second embodiment. The change instruction output section 54 outputs information indicating that the mode has been changed, to update the change table 56 (step S33). Then, MPU 22 ends the parallel control (step S34).

The above process will be specifically described. FIGS. 25 to 28 are conceptual diagrams of memory blocks BLK. In particular, FIGS. 26 and 28 specifically show how data is copied or a cache is reconstructed. Further, description will be given of how the memory block BLK0 operates when the flash memories 11-1 and 11-2 are controlled in parallel. The first to fourth areas of the memory block BLK0 in the flash memory 11-1 are called a first area 64-1 to 67-1. The first to fourth areas of the memory block BLK0 in the flash memory 11-2 are called a first area 64-2 to 67-2.

Figure 25:
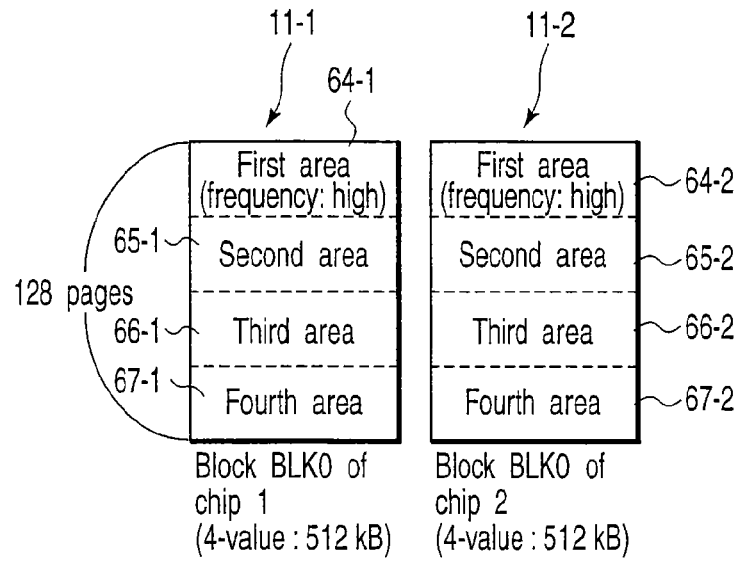
FIG. 25 is a block diagram of the memory block provided in the flash memory in accordance with the third embodiment of the present invention.

First, as shown in FIG. 25, the memory block BLK0 is in the 4-value mode and has 128 pages and a memory size of 512 Kbytes. It is assumed that a write operation is frequently performed on the first area 62 of the memory block BLK0 and that the frequency meets the mode change condition in the condition table 55 in step S25. In this case, the flash memories 11-1 and 11-2 are controlled in parallel. Accordingly, if a write operation is frequently performed on the first area 64-1 of the flash memory 11-1, then obviously, a write operation is also frequently performed on the first area 64-2 of the flash memory 11-2. Thus, the change instruction output section 54 outputs a change instruction to change the first areas 64-1 and 64-2 to the binary mode.

Figure 26:
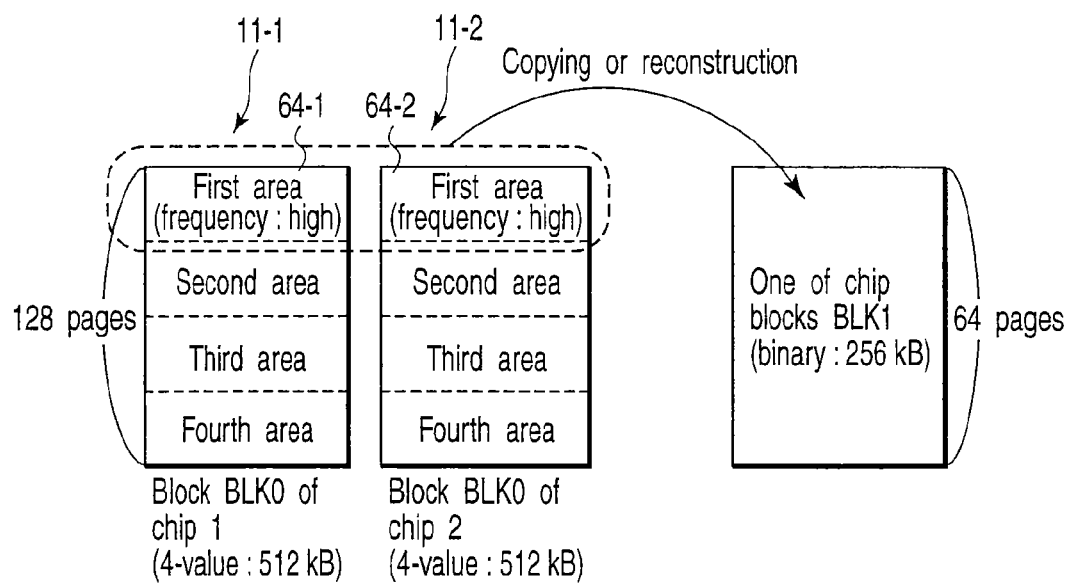
FIG. 26 is a conceptual diagram showing how a cache is reconstructed in the flash memory in accordance with the third embodiment of the present invention.

Then, as shown in FIG. 26, to copy data or reconstruct a cache, the NAND flash memories 11-1 and 11-2 write the data in the first areas 64-1 and 64-2 (128 Kbytes+128 Kbytes=256 Kbytes) to one of the memory blocks BLK in one of the flash memories in the binary mode. The memory block BLK1 is in the binary mode and thus has 64 pages and a memory size of 256 Kbytes.

Figure 27:
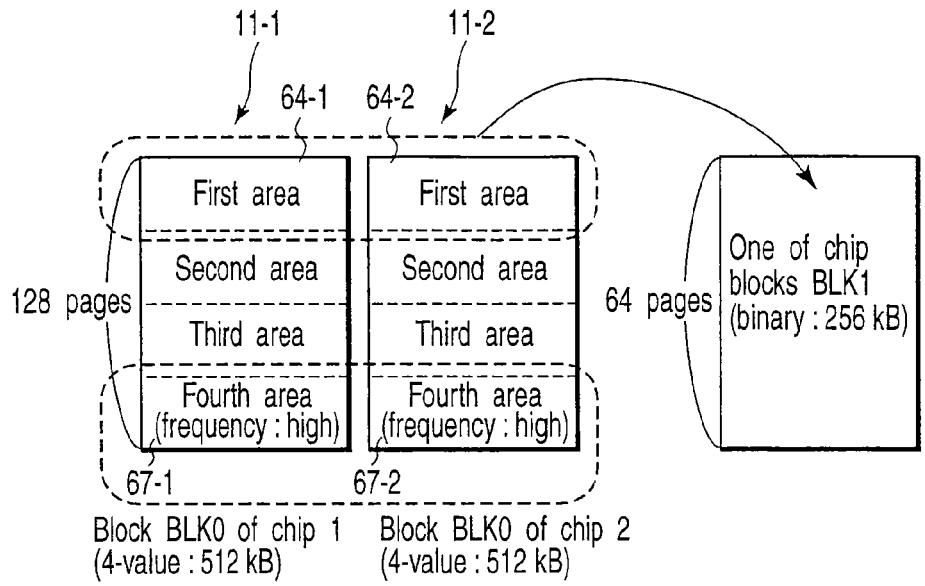
FIG. 27 is a block diagram of the memory block provided in the flash memory in accordance with the third embodiment of the present invention.

Then, as shown in FIG. 27, it is assumed that the frequency of a write operation performed on the fourth areas 67-1 and 67-2 of the memory block BLK0 increases, and in step S31, meets the mode change condition in the condition table 55. Then, the change instruction output section 54 outputs an instruction to change the second areas 67-1 and 67-2 to the binary mode.

Figure 28:
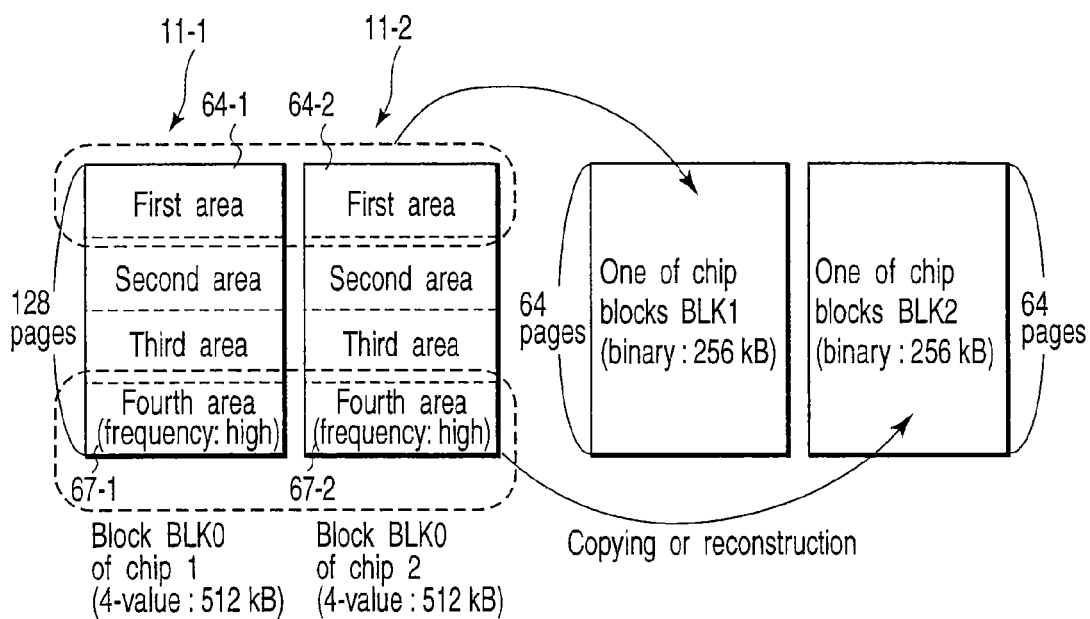
FIG. 28 is a conceptual diagram showing how a cache is reconstructed in the flash memory in accordance with the third embodiment of the present invention.

In accordance with the change instruction, also to copy data or reconstruct a cache, the NAND flash memories 11-1 and 11-2 write the data in the first areas 67-1 and 67-2 (128 Kbytes+128 Kbytes=256 Kbytes) to one of the memory blocks BLK in one of the flash memories in the binary mode. This is shown in FIG. 28. The memory block BLK2 is in the binary mode and thus has 64 pages and a memory size of 256 Kbytes.

As described above, also for a flash memory comprising a plurality of memory chips and controlling the memory chips in parallel, the configuration in accordance with the present embodiment exerts the effects (1) to (3), described in the first and second embodiments. As a result, the configuration also exerts an effect (4) described below.

(4) A Decrease in the Operation Speed of a Flash Memory Including a Plurality of Memory Chips can be Inhibited.

According to the present embodiment, an area in which data is frequently updated is in the binary mode. Then, if for example, four memory chips are controlled in parallel, data is written to one page of each of the four memory chips at a time. Accordingly, if the memory block BLK is in the 4-value mode, the time required to write data to a plurality of areas controlled in parallel is (800 μs×32 pages)=about 25.6 ms.

In this regard, according to the present embodiment, the parallel control is ended when the 4-value mode is changed to the binary mode. However, the write speed at which data is written in the binary mode is half of that in the 4-value mode. Consequently, (400 μs×64 pages)=about 25.6 ms is required to reconstruct a cache for the first areas of the two memory blocks BLK0 in the binary mode as shown in FIG. 28, as is the case with the parallel control. This makes it possible to reduce the number of data copying operations while preventing a decrease in data write speed. As a result, the number of times that data is written to the memory cells can be reduced to improve the reliability of the flash memory. Further, compared to the parallel control of memory chips, the present embodiment can reduce the erase unit, enabling an increase in the degree of freedom of the use of the memory blocks in accordance with the data size.

Figure 29:
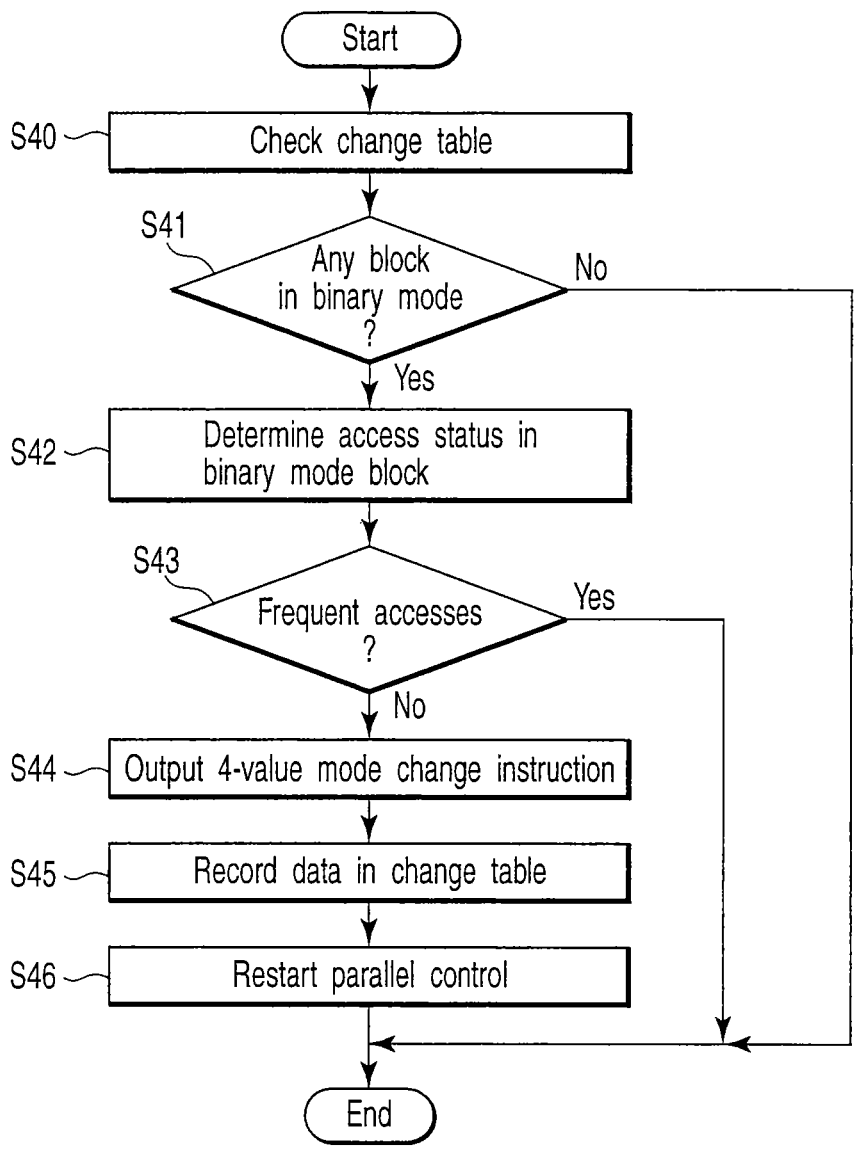
FIG. 29 is a flowchart showing the operation of a card controller provided in a memory card in accordance with a variation of the third embodiment of the present invention.

The above embodiment has been described taking the case in which the card controller 12 changes the 4-value mode to the binary mode. However, as is the case with the second embodiment, the binary mode may be controllably changed to the 4-value mode in accordance with the data update frequency. This will be described with reference to FIG. 29. FIG. 29 is a flowchart showing a process executed by the card controller 12.

First, the change instruction output section 54 checks the change table 56 in the table holding section 52 to determine whether or not any of the memory blocks BLK is in the binary mode (step S40). If any memory block BLK is in the binary mode (step S41, YES), the card controller 12 determines the write access status of that block BLK (step S42). If the memory block BLK is not frequently accessed (step S43, NO), the change instruction output section 54 outputs an instruction to change from the binary mode to the 4-value mode (step S44). The change instruction output section 54 outputs information indicating that the mode has been changed, to update the change table 56 (step S45). This process is similar to steps S20 to S25, described with reference to FIG. 19. Subsequently, the memory controller 12 restarts the parallel control (step S46).

The above method enables only the required area to be set in the binary mode only for the required period. This allows the memory areas of the NAND flash memory 11 to be used more efficiently.

The above embodiment has been described taking the case in which a plurality of memory chips are controlled in parallel. However, the present embodiment is applicable to the case in which a plurality of memory blocks BLK in the same chip are controlled in parallel.

As described above, the semiconductor memory device and the memory card in accordance with the first to third embodiments of the present invention binarizes the area in which data is frequently updated, while writing data to the other areas in a multi-value mode for at least four values (2 bit). This enables a reduction in the number of data copying operations and cache reconstructing operations and an increase in the data write speed, allowing the reliability of the semiconductor memory device to be improved.

The above embodiment has been described in conjunction with the 4-value (2 bit) mode and the binary (1 bit) mode. However, the multi-level NAND flash memory may be able to hold data with 8 (3 bit), 16 (4 bit), or 32 (8 bit) values. In this case, for the area in which data is frequently updated, for example, the 8-value mode may be changed to the 4-value mode or the 16-value mode may be changed to the 8-valued mode. Further, free and appropriate settings can be made; the 8-value mode may be changed to the binary mode or the 32-value mode may be changed to the 4-value mode. In this case, the size of the area to be monitored for the access frequency (the first area 60, the second area 61, or the like) may be determined depending on the memory size of the memory block BLK to which data is copied or which is used as a cache.

According to the second embodiment, whether or not to binarize an area is determined depending on the access frequency as described with reference to FIGS. 15 to 18. In this case, the binarized area may not be used but may be used for copying or reconstruction. This is shown in FIG. 30. FIG. 30 is a conceptual diagram of memory blocks BLK.

For example, as described in the second embodiment with reference to FIG. 16, it is assumed that in the binary mode, the data in the first area of the memory block BLK0 is copied to the memory block BLK1 or the memory block BLK1 is reconstructed into a cache. In this case, as shown in FIG. 30, the first area 62 is no longer used. Then, when the binarization becomes unnecessary, the data in the memory block BLK1 is written back to the first area 62 in the memory block BLK0 in the 4-value mode.

Further, when one of the areas is binarized, the other area may be binarized regardless of the access frequency. This is shown in FIG. 31. For example, it is assumed that the access frequency of the first area 62 of the memory block BLK0 increases, so that the data in the first area 62 is written to the memory block BLK1 in the binary mode. Then, the memory block BLK0 is used only by the second area 63. Consequently, when a write access is made to the second area 63, the data is unconditionally written to the memory block BLK2 also for the second area 63.

Further, if the second area 63 is accessed with the first area 62 binarized, the data in the first area 62 and the data in the second area 63 may be collectively copied to one of the memory blocks BLK in the binary mode.

Furthermore, in the embodiments, data "11", "01", "10" and "00" are arranged in order of increasing threshold voltage, but the order is not limited to above case. For example, data "11", "01", "00", "10" is arranged in the order of increasing threshold voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A controller comprising:
   an interface configured to execute interfacing process with a host apparatus; and
   a processor configured to control a memory, the memory including a first memory block and a second memory block, the first memory block and the second memory block including memory cells each capable of holding i-bit data (where i is natural number greater than or equal to 2),
   wherein the processor instructs the memory to write first data received from the host apparatus in the first memory block such that the memory cells written with the first data in the first memory block each store j-bit data (where j is natural number lower than i); and
   the processor instructs the memory to copy the first data in the first memory block to the second memory block such that the memory cells written with the first data in the second memory block each store k-bit data (where k is natural number lower than i).

2. The controller according to claim 1, wherein the memory cells written with the first data in the first memory block are assigned to i number of first pages,
   the memory cells written with the first data in the second memory block are assigned to i number of second pages,
   the processor instructs the memory to write the first data in the first memory block using j number of first pages among the i number of first pages, and
   the processor instructs the memory to write the first data in the second memory block using k number of second pages among the i number of second pages.

3. The controller according to claim 1, wherein the memory further comprises a third memory block, and
   the processor instructs the memory to write second data received from the host apparatus in the third memory block such that each of memory cells in the third memory block stores i-bit data.

4. The controller according to claim 3, wherein the memory cells written with the second data in the third memory block are assigned to i number pages, and
   the processor instructs the memory to write the second data in the third memory block using all of the i number of first pages.

5. The controller according to claim 1, wherein the first data includes boot information, partition management information, and a file allocation table.

6. The controller according to claim 4, wherein the third memory block includes a plurality of areas each including a plurality of the memory cells, and
  the processor instructs the memory to copy the second data in one of the areas to the first or second memory block in accordance with a frequency of the write access to each of the areas.

7. The controller according to claim 6, further comprising:
  a counter which counts the number of write accesses to each of the areas;
  a threshold holding module which has a threshold for a write access frequency;
  a comparator which compares a count in the counter with the threshold held in the threshold holding module; and
  an instruction output module which, if the count corresponding to any of the areas exceeds the threshold, instructs the memory to copy the data in the area to the first or second memory block.

8. The controller according to claim 6, further comprising a table which holds information indicating the number of bits each held in the memory cells in the first, second, and third memory block.

9. The controller according to claim 7, wherein the counter counts the number of the write accesses to the first or second memory block to which the data in the area is copied,
  the comparator compares the number of the write accesses to the first or second memory block to which the data in the area is copied with the threshold; and
  if the number of the write accesses is smaller than the threshold, the instruction output module instructs the memory to write the data in the first or second memory block back to the third memory block.

10. The controller according to claim 4, wherein the processor instructs the memory to
  write data received from the host apparatus to the third memory block, and
  write management information of the data received from the host apparatus to the first memory block.

11. A controller comprising:
  an interface configured to execute interfacing process with a host apparatus; and
  a processor configured to control a memory, the memory including a first memory block and a second memory block, the first memory block and the second memory block including memory cells each capable of holding i-bit data (where i is natural number greater than or equal to 2),
  wherein the processor instructs the memory to write first data received from the host apparatus in the first memory block such that the memory cells written with the first data in the first memory block each store j-bit data (where j is natural number lower than i);
  the processor instructs the memory to write second data received from the host apparatus in the first memory block such that the memory cells written with the second data in the first memory block each store j-bit data, the second data updating the first data written in the first memory block; and
  the processor instructs the memory to copy the second data in the first memory block to the second memory block such that the memory cells written with the second data in the second memory block each store k-bit data (where k is natural number lower than i).

12. The controller according to claim 11, wherein the memory cells in the first memory block comprises a first group of memory cells and a second group of memory cells different from the first group of memory cells,
  the processor instructs the memory to write the first data in the first group of the memory cells, and
  the processor instructs the memory to write the second data in the second group of memory cells.

13. The controller according to claim 11, wherein the memory cells written with the first data in the first memory block are assigned to i number of first pages,
  the memory cells written with the second data in the first memory block are assigned to i number of second pages,
  the processor instructs the memory to write the first and second data in the first memory block using j number of first pages among the i number of first pages, and
  the processor instructs the memory to write the second data in the second memory block using k number of second pages among the i number of second pages.

14. The controller according to claim 11, wherein the memory further comprises a third memory block, and
  the processor instructs the memory to write third data received from the host apparatus in the third memory block such that each of the memory cells in the third memory block stores i-bit data.

15. The controller according to claim 14, wherein the memory cells written with the third data in the third memory block are assigned to i number pages, and
  the processor instructs the memory to write the third data in the third memory block using all of the i number of first pages.

16. The controller according to claim 11, wherein the first data and the second data include boot information, partition management information, and a file allocation table.

17. The controller according to claim 15, wherein the third memory block includes a plurality of areas each including a plurality of the memory cells, and
  the processor instructs the memory to copy the third data in one of the areas to the first or second memory block in accordance with a frequency of the write access to each of the areas.

18. The controller according to claim 17, further comprising:
  a counter which counts the number of write accesses to each of the areas;
  a threshold holding module which has a threshold for a write access frequency;
  a comparator which compares a count in the counter with the threshold held in the threshold holding module; and
  an instruction output module which, if the count corresponding to any of the areas exceeds the threshold, instructs the memory to copy the data in the area to the first or second memory block.

19. The controller according to claim 17, further comprising a table which holds information indicating the number of bits each held in the memory cells in the first, second, and third memory block.

20. The controller according to claim 15, wherein the processor instructs the memory to
  write data received from a host apparatus to the third memory block, and
  write management information of the data received from the host apparatus to the first or second memory block.

* * * * *